US011476377B2

(12) United States Patent
Oh et al.

(10) Patent No.: US 11,476,377 B2
(45) Date of Patent: Oct. 18, 2022

(54) SOLAR CELL AND SOLAR CELL PANEL INCLUDING THE SAME

(71) Applicant: LG ELECTRONICS INC., Seoul (KR)

(72) Inventors: Donghae Oh, Seoul (KR); Jinsung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/557,501

(22) Filed: Aug. 30, 2019

(65) Prior Publication Data

US 2020/0075788 A1 Mar. 5, 2020

(30) Foreign Application Priority Data

Sep. 5, 2018 (KR) .................. 10-2018-0105990

(51) Int. Cl.
| | |
|---|---|
| *H01L 31/05* | (2014.01) |
| *H01L 31/0224* | (2006.01) |
| *H01L 31/0236* | (2006.01) |
| *H01L 31/0216* | (2014.01) |
| *H01L 31/068* | (2012.01) |
| *H01L 31/02* | (2006.01) |

(52) U.S. Cl.
CPC ...... *H01L 31/0508* (2013.01); *H01L 31/0201* (2013.01); *H01L 31/02167* (2013.01); *H01L 31/02366* (2013.01); *H01L 31/022425* (2013.01); *H01L 31/068* (2013.01)

(58) Field of Classification Search
CPC .................. H01L 31/02008–02013; H01L 31/022425–022433; H01L 31/05–0516; H01L 31/04–078; Y02E 10/50–56
See application file for complete search history.

(56) References Cited

U.S. PATENT DOCUMENTS

| 9,960,290 B2 * | 5/2018 | Kim .................... H01L 31/0508 |
| 2010/0147374 A1 * | 6/2010 | Du .................. H01L 31/022425 |
| | | 257/E31.127 |

(Continued)

FOREIGN PATENT DOCUMENTS

| JP | 2011077362 A * | 4/2011 |
| KR | 10-2013-0065493 A | 6/2013 |

(Continued)

*Primary Examiner* — William E McClain
(74) *Attorney, Agent, or Firm* — Birch, Stewart, Kolasch & Birch, LLP

(57) ABSTRACT

A solar cell according to an embodiment of the present invention includes a semiconductor substrate; a first conductive type region positioned at or on the semiconductor substrate; and a first electrode electrically connected to the first conductive type region. The first electrode includes a plurality of first finger lines formed in a first direction and parallel to each other; and a plurality of first bus bars including a plurality of first pad portions positioned in a second direction intersecting with the first direction. The plurality of first finger lines include a contact portion which is in direct contact with the first conductive type region. The plurality of first pad portions have a different material, a composition, or a multi-layered structure that is different from that of the plurality of first finger lines, and are spaced apart from the first conductive type region.

16 Claims, 18 Drawing Sheets

(56) References Cited

U.S. PATENT DOCUMENTS

| | | | |
|---|---|---|---|
| 2010/0294359 A1* | 11/2010 | Anderson | C03C 8/10 |
| | | | 136/256 |
| 2014/0318613 A1* | 10/2014 | Von Campe | H01L 31/0201 |
| | | | 136/256 |
| 2014/0370311 A1* | 12/2014 | Boulord | B23K 35/3608 |
| | | | 428/457 |
| 2015/0007865 A1* | 1/2015 | Steckemetz | H01L 31/0504 |
| | | | 136/244 |
| 2015/0243818 A1 | 8/2015 | Kim et al. | |
| 2015/0255632 A1* | 9/2015 | Kritchman | H01L 31/022433 |
| | | | 136/256 |
| 2016/0005905 A1* | 1/2016 | Jang | H01L 31/0504 |
| | | | 136/244 |
| 2016/0093752 A1* | 3/2016 | Kim | H01L 31/0504 |
| | | | 136/244 |
| 2016/0284893 A1* | 9/2016 | Teramura | H01L 31/0465 |
| 2016/0322527 A1* | 11/2016 | Hwang | H01L 31/0201 |
| 2020/0091351 A1* | 3/2020 | Oh | H01L 31/022425 |

FOREIGN PATENT DOCUMENTS

| | | |
|---|---|---|
| KR | 10-1680037 B1 | 12/2016 |
| KR | 10-2018-0001203 A | 1/2018 |
| KR | 10-2018-0037666 A | 4/2018 |

\* cited by examiner

SOLAR CELL AND SOLAR CELL PANEL INCLUDING THE SAME

CROSS-REFERENCE TO RELATED APPLICATION

This application claims priority to and the benefit of Korean Patent Application No. 10-2018-0105990 filed in the Korean Intellectual Property Office on Sep. 5, 2018, the entire contents of which are incorporated herein by reference in its entirety.

BACKGROUND OF THE INVENTION

Field of the Invention

Embodiments of the invention relate to a solar cell and a solar cell panel including the same, and more particularly to a solar cell improved in electrode structure and a solar cell panel including the same.

Description of the Related Art

A plurality of solar cells are connected in series or in parallel by a ribbon, and are manufactured in a form of a solar cell panel by a packaging process for protecting the plurality of solar cells.

However, when the solar cell is connected using the ribbon having a large width of about 1.5 mm, optical loss can occur due to a large width of the ribbon. Therefore, the number of ribbons disposed in the solar cell should be reduced. On the other hand, when the number of the ribbons is increased in order to reduce a movement distance of carriers, the resistance is lowered, but the output can be largely lowered due to the shading loss. Therefore, a wiring material having a width smaller than that of the ribbon can be used in place of the ribbon, which can cause problems such as deterioration of attachment characteristics of the wiring material in a specific region. An area of an electrode attached to the wiring material in the specific region can be increased in order to prevent the deterioration of the attachment characteristics in the specific region. In this instance, the amount of material for forming the electrode and the optical loss are increased, and the area of the electrode contacting the conductive type region is increased to increase the recombination of the carriers, so that the open circuit voltage and current density of the solar cell could be reduced. This problem could be caused even more when the wiring material is included in a large number.

SUMMARY OF THE INVENTION

The present invention provides a solar cell and a solar cell panel including the same that can reduce an amount of electrode material and an area of an electrode contacting a conductive type region while improving attachment characteristics of a wiring member.

In particular, the present invention provides a solar cell and a solar cell panel including the same that can improve the characteristics and simplify a manufacturing process by reducing the amount of the electrode material and the area of the electrode while preventing deterioration of the attachment characteristics of the wiring member that can occur in a part adjacent to an edge of the solar cell when the wiring member having a small width or a rounded shape is applied.

A solar cell according to an embodiment of the present invention includes a photoelectric conversion unit and a first electrode electrically connected to the photoelectric conversion unit. Here, the photoelectric conversion unit includes a semiconductor substrate, a first conductive type region positioned at or on the semiconductor substrate. The first electrode includes a plurality of first finger lines (a first finger electrode or a first carrier collecting electrode) formed in a first direction and parallel to each other, and a plurality of first bus bars (a first collector or a first external connection electrode) including a plurality of first pad portions (a first contact portion or a first contact portion) positioned in a second direction intersecting with the first direction. The plurality of first finger lines each includes a contact portion which is in direct contact with the first conductive type region. The plurality of first pad portions have a different material, a different composition, or is a multi-layered structure that is different from that of the plurality of first finger lines, and are spaced apart from the first conductive type region.

The plurality of first bus bars can further include a first line portion connecting at least a part of the plurality of first pad portions, and the first line portion can be in direct contact with or spaced apart from the first conductive type region.

The first line portion can include a first layer composed of the same material or the same layer as the plurality of first pad portions, and a second layer composed of the same material or the same layer as the first finger line and positioned on the first layer.

A part of the plurality of first finger lines can be positioned on the plurality of first pad portions.

The plurality of first finger lines can include the contact portion which is in direct contact with the first conductive type region at a part not overlapping the first pad portion, and a non-contact portion which is spaced apart from the first conductive type region with the first pad portion interposed therebetween at a part overlapping the first pad portion.

The plurality of first pad portions can include an outer pad positioned to be adjacent to an edge of the semiconductor substrate in the second direction, and a plurality of inner pads positioned inside the outer pad. A length of the outer pad can be longer than a length of the inner pad.

The plurality of first pad portions can include an outer pad positioned to be adjacent to an edge of the semiconductor substrate in the second direction, and a plurality of inner pads positioned inside the outer pad. The outer pad can include a plurality of dividing portions having a non-forming portion having an interval or a length smaller than an average interval of the plurality of inner pads. A total length of the outer pad can be greater than a length of the inner pad.

A distance between the plurality of dividing portions or a length of the non-forming portion can be less than or equal to three times a pitch of the first finger line.

The distance between the dividing portions or the length of the non-forming portion can be equal to or smaller than the pitch of the first finger line.

An edge of the outer pad adjacent to the edge of the semiconductor substrate can be spaced a first distance from an outermost first finger line of the plurality of first finger lines, and the total length of the outer pad can be equal to or less than the first distance in the second direction.

The dividing portion can overlap the first finger line or can be positioned between the first finger lines.

The solar cell can further include a connecting portion connecting the plurality of dividing portions in the second direction.

A length of the dividing portion can be equal to, less than, or greater than the length of the inner pad.

The solar cell can further include a protective layer (an insulating layer, a dielectric layer, or a passivation layer) formed on the first conductive type region. The plurality of first finger lines can be in contact with the first conductive type region passing through the protective layer, and the first pad portion can be positioned on the protective layer and can be not in contact with the first conductive type region.

The solar cell can further include a protective layer (an insulating layer, a dielectric layer, or a passivation layer) formed on the first conductive type region. The plurality of first finger lines can include a glass frit passing through the protective layer by heat treatment, and the plurality of first pad portions need not include the glass frit passing through the protective layer by heat treatment or can include the glass frit less than the plurality of first finger lines.

The plurality of first bus bars can further include a first line portion connecting the plurality of first pad portions.

The solar cell can further include a second conductive type region, and a second electrode electrically connected to the second conductive type region. The second electrode can include a plurality of second finger lines formed in a first direction and parallel to each other, and a plurality of second bus bars including a plurality of second pad portions positioned in the second direction.

Each of the plurality of second finger lines and the plurality of second bus bars can include a contact portion which is in direct contact with the second conductive type region.

The plurality of second finger lines and the plurality of second pad portions can have the same material, the same composition, or the same multi-layered structure, or the plurality of second finger lines and the plurality of second pad portions can have a different material, a different composition, or a different multi-layered structure.

A solar cell panel according to an embodiment of the present invention includes a plurality of solar cells including first and second solar cells having the above-described structure; and a plurality of wiring members electrically connecting the first and second solar cells.

Each of the plurality of wiring members can include a core layer, and a solder layer formed on a surface of the core layer and soldered to the first pad portion.

A number of the plurality of wiring members can be 5 to 33 in the first direction based on one surface of the solar cell, a width of each of the plurality of wiring members can be 250 to 500 um, or the plurality of wiring members can have a cross-sectional shape including circular or rounded portions.

A total length of the outer pad can be not more than 20 times a width of the plurality of wiring members in the second direction.

According to the present embodiment, the electrode includes a finger line composed of a contact electrode and a plurality of pad portions composed non-contact electrodes, so that it is possible to sufficiently secure the movement path of the carrier while reducing the contact area between the electrode and the conductive type region. Accordingly, it is possible to improve the efficiency of the solar cell and improve the output of the solar cell panel by increasing the open circuit voltage and the current density of the solar cell. At this time, when a wiring member having a small width or a rounded shape is applied, it is possible to prevent deterioration of the attachment characteristics of the wiring member that can occur at a part adjacent to the edge of the solar cell by a plurality of dividing portions. Further, even when a large number of wiring members are used by the plurality of dividing portions, it is possible to improve the characteristics and simplify the manufacturing process by reducing the amount of the electrode material and the area of the electrodes.

DETAILED DESCRIPTION OF THE EMBODIMENTS

Figure 1:
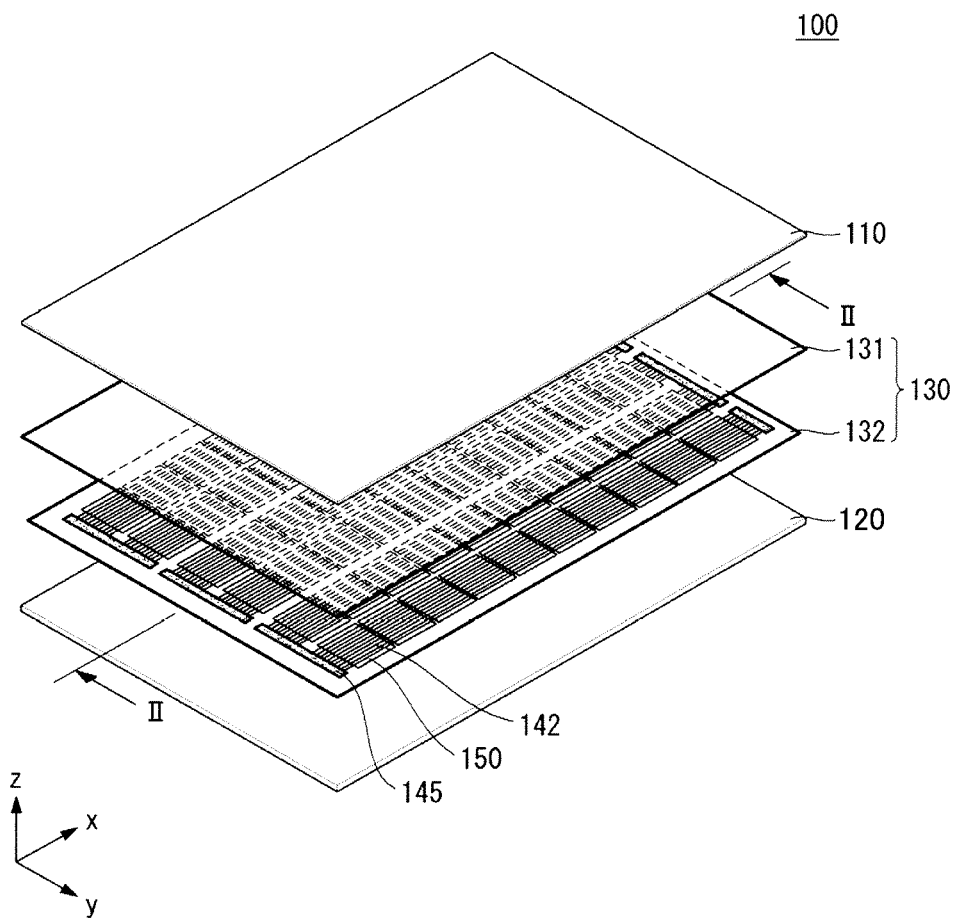
FIG. 1 is a perspective view illustrating a solar cell panel according to an embodiment of the present invention.

Hereinafter, embodiments of the present invention will be described in detail with reference to the accompanying drawings. However, the present invention is not limited to these embodiments and the embodiments of the present invention can be modified into various forms.

In the drawings, illustration of the parts not related to the description is omitted in order to clarify and briefly describe the present invention, and the same reference numerals are used for the same or similar parts throughout the specification. In the drawings, the thickness, width, and the like are enlarged or reduced to make the explanation more clear, and the thickness, width, etc. of the present invention are not limited to those shown in the drawings.

When a part is referred to as "including" another part throughout the specification, it does not exclude other parts and can further include other parts unless specifically stated otherwise. Further, when a part of a layer, a film, a region, a plate, or the like is referred to as being "on" other part, this includes not only the instance where it is "directly on" the other part but also the instance where the other part is positioned in the middle. When the part of the layer, the film, the region, the plate, or the like is referred to as being "directly on" the other part, it means that no other part is positioned in the middle.

Hereinafter, a solar cell and a solar cell panel including the solar cell according to an embodiment of the present invention will be described in detail with reference to the accompanying drawings. In the following, the expressions "first", "second", "third", etc. are used only to distinguish each other, but the embodiments of the present invention are not limited thereto.

Figure 2:
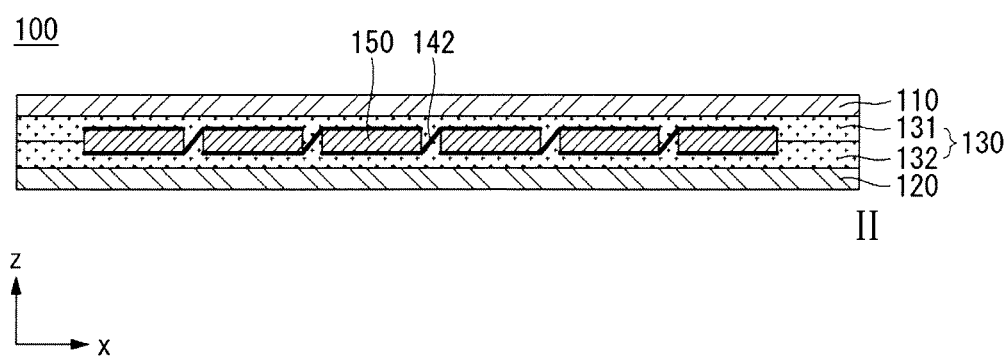
FIG. 2 is a cross-sectional view taken along a line II-II in FIG. 1.

FIG. 1 is a perspective view illustrating a solar cell panel according to an embodiment of the present invention, and FIG. 2 is a cross-sectional view taken along a line II-II in FIG. 1.

Referring to FIGS. 1 and 2, a solar cell panel 100 according to the present embodiment includes a plurality of solar cells 150 and a wiring member (or a wire, an interconnector, etc.) 142 for electrically connecting the plurality of solar cells 150. The solar cell panel 100 includes a sealing member 130 that surrounds and seals the plurality of solar cells 150 and the wiring member (or the interconnector) 142 for connecting them, a first cover member 110 positioned on a front surface of the solar cell 150 on the sealing member 130, and a second cover member 120 positioned on a back surface of the solar cell 150 on the sealing member 130. This will be explained in more detail.

First, the solar cell 150 can include a photoelectric conversion unit that converts the solar cell into electric energy, and an electrode that is electrically connected to the photoelectric conversion unit to collects and transfers a current. The plurality of solar cells 150 can be electrically connected in series, parallel, or series-parallel by the wiring member 142. Specifically, the wiring member 142 electrically connects two neighboring solar cells 150 among the plurality of solar cells 150.

A bus ribbon 145 alternately connects two ends of the wiring member 142 of the solar cell 150 (i.e., solar cell strings) connected by the wiring material 142 to form one row. The bus ribbon 145 can be disposed at an end of the solar cell string and in a direction intersecting the end. This bus ribbon 145 can connect the solar cell strings adjacent to each other, or can be connected to the solar cell string or a junction box (not shown) that prevents reverse flow of the current of the solar cell strings. The material, shape, connection structure, etc. of the bus ribbon 145 can be variously modified, and the embodiments of the present invention are not limited thereto.

The sealing member 130 can include a first sealing member 131 positioned on the front surface of the solar cell 150 connected by the wiring member 142, and a second sealing member 132 positioned on the back surface of the solar cell 150. The first sealing member 131 and the second sealing member 132 prevent moisture and oxygen from entering and chemically binding each element of the solar cell panel 100. The first and second sealing members 131 and 132 can be made of an insulating material having transparency and adhesiveness. For example, an ethylene-vinyl acetate copolymer resin (EVA), a polyvinyl butyral, a silicon resin, an ester-based resin, an olefin-based resin, or the like can be used for the first sealing member 131 and the second sealing member 132. The second cover member 120, the second sealing member 132, the solar cell 150, the first sealing member 131, and the first cover member 110 are integrated to form the solar cell panel 100 by a lamination process or the like using the first and second sealing members 131 and 132.

The first cover member 110 is positioned on the first sealing member 131 to constitute the front surface of the solar cell panel 100, and the second cover member 120 is positioned on the second sealing member 132 to constitute the back surface of the solar cell 150. The first cover member 110 and the second cover member 120 can be made of an insulating material capable of protecting the solar cell 150 from external shock, moisture, ultraviolet rays, or the like. The first cover member 110 can be made of a light transmitting material capable of transmitting light, and the second cover member 120 can be made of a sheet composed of a light transmitting material, a non-light transmitting material, or a reflective material. For example, the first cover member 110 can be composed of a glass substrate or the like, and the second cover member 120 can have a TPT (Tedlar/PET/Tedlar) type, or include a polyvinylidene fluoride (PVDF) resin layer formed on at least one surface of a base film (for example, polyethylene terephthalate (PET)).

However, the embodiments of the present invention are not limited thereto. Accordingly, the first and second sealing members 131 and 132, the first cover member 110, or the second cover member 120 can include various materials other than those described above, and can have various shapes. For example, the first cover member 110 or the second cover member 120 can have various shapes (for example, a substrate, a film, a sheet, etc.) or materials.

Figure 3:
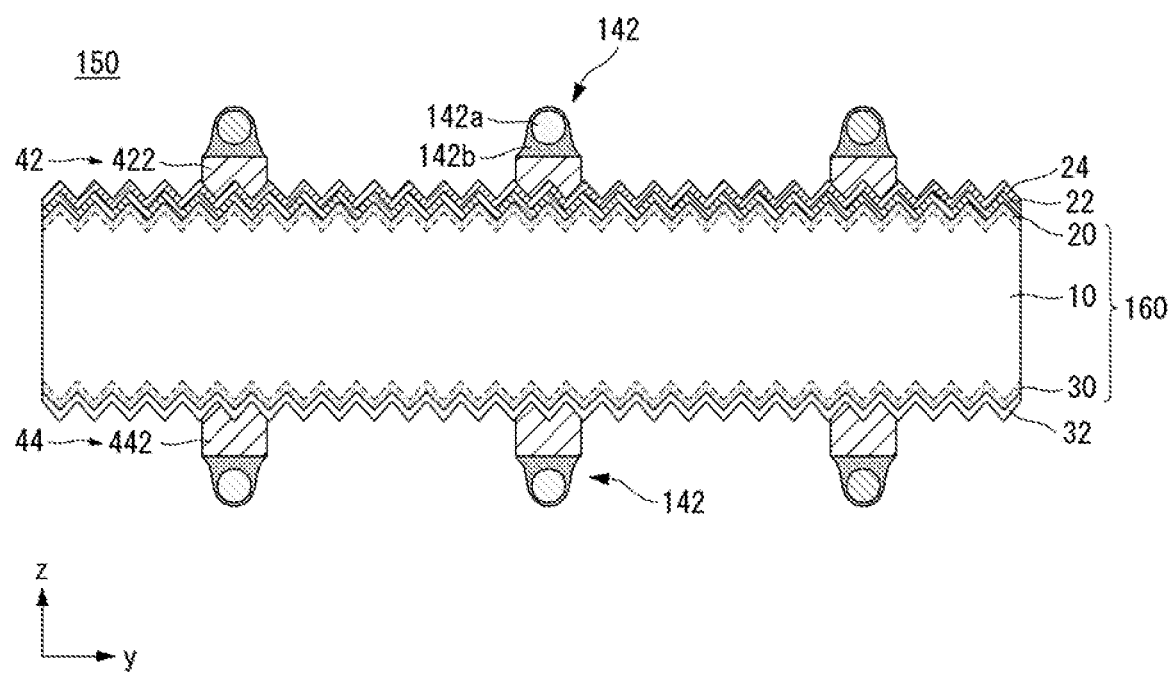
FIG. 3 is a partial cross-sectional view illustrating a solar cell and a wiring member connected thereto which are included in a solar cell panel shown in FIG. 1.

The solar cell 150 and the wiring member 142 connected thereto according to the embodiment of the present invention will be described in more detail with reference to FIG. 3. FIG. 3 is a partial cross-sectional view illustrating the solar cell 150 and the wiring member 142 connected thereto which are included in the solar cell panel 100 shown in FIG. 1. For simplicity, electrodes 42 and 44 are schematically shown in FIG. 3.

Referring to FIG. 3, the solar cell 150 includes a semiconductor substrate 160, conductive type regions 20 and 30 formed at or on the semiconductor substrate 160, and electrodes 42 and 44 connected to the conductive type regions 20 and 30. The conductive type regions 20 and 30 can include a first conductive type region 20 having a first conductive type and a second conductive type region 30 having a second conductive type. The electrodes 42 and 44 can include a first electrode 42 connected to the first conductive type region 20 and a second electrode 44 connected to the second conductive type region 30. The solar cell 150 can further include first and second passivation layers 22 and 32, an anti-reflection layer 24, and the like.

The semiconductor substrate 160 can be composed of a crystalline semiconductor (for example, a single crystal or polycrystalline semiconductor, for example, a single crystal or polycrystalline silicon) including a single semiconductor material (for example, a group 4 element). Then, since the semiconductor substrate 160 having a high degree of crystallinity and having few defects is used as a base, the solar cell 150 can have excellent electrical characteristics.

The front surface and/or the back surface of the semiconductor substrate 160 can be textured to have unevenness. The unevenness can have, for example, a pyramid shape having an irregular size, whose outer surface is composed of the plane (111) of the semiconductor substrate 160. As a result, the reflectance of light can be reduced while having a relatively large surface roughness. However, the embodiments of the present invention are not limited thereto.

In this embodiment, the semiconductor substrate 160 includes a base region 10 having the first or second conductive type by dopping a first or second conductive type dopant with a lower doping concentration than the first or second conductive type region 20, 30. As an example, the base region 10 can have the second conductive type in this embodiment.

As an example, the first conductive type region 20 can constitute an emitter region that forms a p-n junction with the base region 10. The second conductive type region 30 can form a back surface field to form a back field region for preventing recombination. Here, the first and second conductive type regions 20 and 30 can be formed as a whole on the front surface and the back surface of the semiconductor substrate 160. Thus, the first and second conductive type regions 20 and 30 can be formed with a sufficient area without additional patterning. However, the embodiments of the present invention are not limited thereto.

In this embodiment, the base region 10 and the conductive type regions 20 and 30 constituting the semiconductor substrate 160 are exemplified as regions having a crystal structure of the semiconductor substrate 160 and different conductive type, doping concentration. That is, it is illustrated that the conductive type regions 20 and 30 are doped regions constituting a part of the semiconductor substrate 160. However, the embodiments of the present invention are not limited thereto. Therefore, at least one of the first conductive type region 20 and the second conductive type region 30 can be formed of an amorphous, microcrystalline or polycrystalline semiconductor layer or the like, which is formed on the semiconductor substrate 160 as a separate layer. Other variations are possible.

The first conductive type dopant included in the first conductive type region 20 can be an n-type or p-type dopant, and the second conductive type dopant included in the base region 10 and the second conductive type region 30 can be a p-type or n-type dopant. Group 3 elements such as boron (B), aluminum (Al), gallium (Ga), or indium (In) can be used as the p-type dopant, and group 5 elements such as phosphorus (P), arsenic (As), bismuth (Bi), and antimony (Sb) can be used as the n-type dopant. The second conductive type dopant in the base region 10 and the second conductive type dopant in the second conductive type region 30 can be the same material or different materials.

For example, the first conductive type region 20 can have a p-type, the base region 10 and the second conductive type region 30 can have an n-type. Then, holes having a slower moving speed than electrons can move to the front surface of the semiconductor substrate 160, rather than the back surface thereof, thereby improving the conversion efficiency. However, the embodiments of the present invention are not limited thereto, and the opposite instance is also possible.

An insulating layer (a protective layer or a dielectric layer) such as the first and second passivation layers 22 and 32 for immobilizing defects of the conductive type regions 20 and 30 and the anti-reflection layer 24 for preventing reflection of light can be formed on the surface of the semiconductor substrate 160. Such an insulating layer can be composed of an undoped insulating layer which does not contain a dopant separately. The first and second passivation layers 22 and 32 and the anti-reflection layer 24 can be formed substantially entirely on the entire surface of the semiconductor substrate 160 except for parts (more precisely, parts where a first or second opening is formed) corresponding to the first or second electrode 42, 44.

For example, the first or second passivation layer 22, 32 or the anti-reflection layer 24 can have a silicon nitride layer, a silicon nitride layer containing hydrogen, a silicon oxide layer, a silicon oxynitride layer, an aluminum oxide layer, any one single layer selected from a group consisting of $MgF_2$, $ZnS$, $TiO_2$ and $CeO_2$ or a multi-layered structure in which two or more layers are combined. For example, the first or second passivation layer 22 or 32 can include a silicon oxide layer, a silicon nitride layer, or the like having a fixed positive charge when the first or second conductive type region 20 or 30 has an n-type, and can include an aluminum oxide layer, or the like having a fixed negative charge when the first or second conductive type region 20 or 30 has a p-type. As one example, the anti-reflection layer 24 can include silicon nitride. In addition, the material of the insulating layer, the multi-layered structure, and the like can be variously modified.

The first electrode 42 is electrically connected to the first conductive type region 20 through a first opening and the second electrode 44 is electrically connected to the second conductive type region 30 through a second opening. The first and second electrodes 42 and 44 are made of various materials (for example, metal materials) and can be formed to have various shapes. The shape of the first and second electrodes 42 and 44 will be described later.

As described above, in this embodiment, the first and second electrodes 42 and 44 of the solar cell 150 have a certain pattern, and the solar cell 150 has a bi-facial structure in which light can be incident on the front surface and the back surface of the semiconductor substrate 160. Accordingly, the amount of light used in the solar cell 150 can be increased to contribute to the efficiency improvement of the solar cell 150.

However, the embodiments of the present invention are not limited thereto, and it is also possible that the second electrode 44 is formed entirely on the back surface of the semiconductor substrate 160. It is also possible that the first and second conductive type regions 20 and 30 and the first and second electrodes 42 and 44 are positioned together on one surface (for example, the back surface) of the semiconductor substrate 160, and it is also possible that at least one of the first and second conductive type regions 20 and 30 is formed over both surface of the semiconductor substrate 160. That is, the solar cell 150 described above is merely an example, and the embodiments of the present invention are not limited thereto.

The solar cell 150 described above is electrically connected to the neighboring solar cell 150 by the wiring member 142 positioned (e.g., in contact with) on the first electrode 42 or the second electrode 44, and this will be described in more detail with reference to FIG. 4 together with FIG. 1 to FIG. 3.

Figure 4:
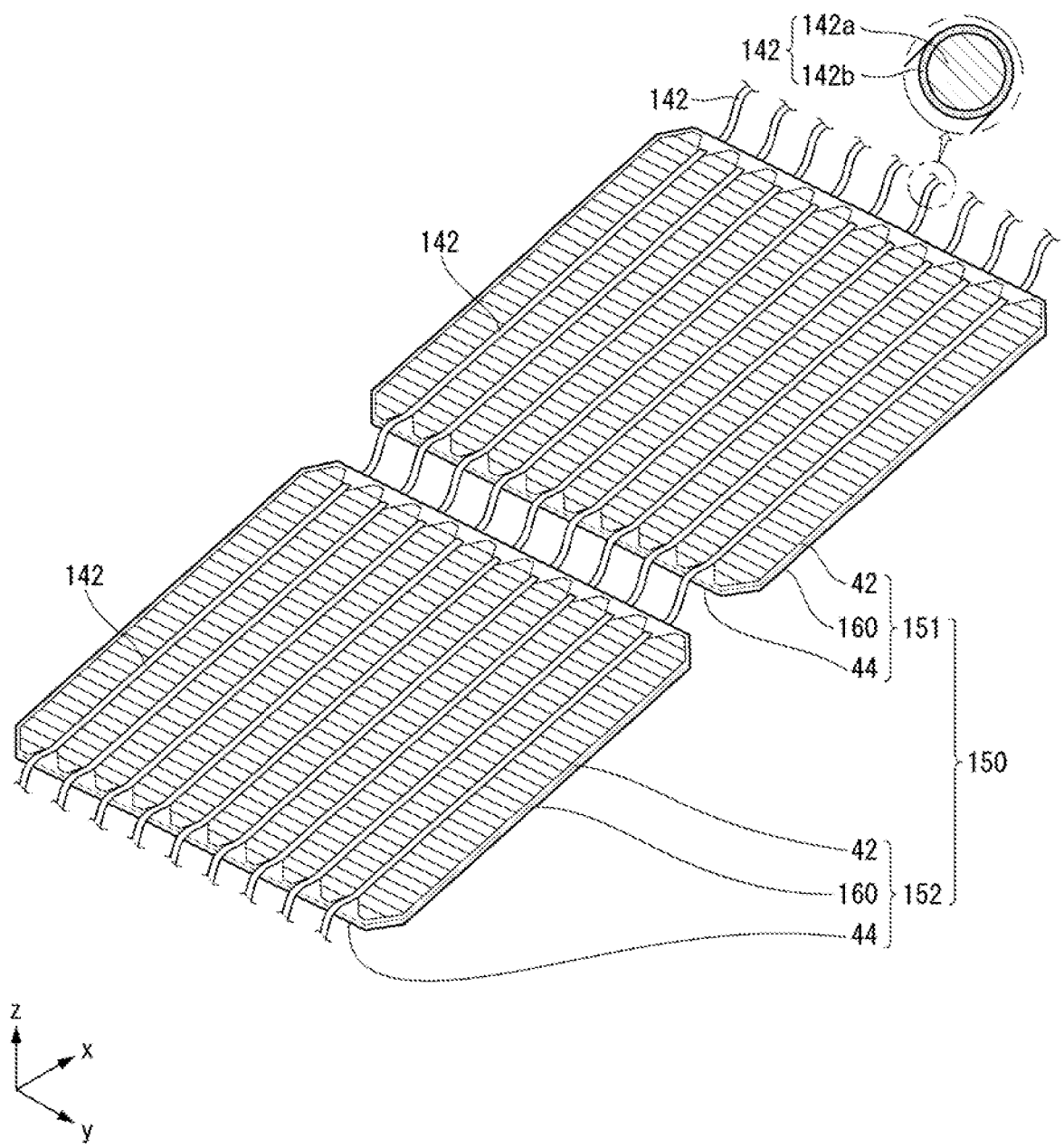
FIG. 4 is a perspective view schematically showing a first solar cell and a second solar cell which are included in a solar cell panel shown in FIG. 1 and connected by a wiring member.

FIG. 4 is a perspective view schematically showing a first solar cell 151 and a second solar cell 152 which are included in the solar cell panel 100 shown in FIG. 1 and connected by the wiring member 142. In FIG. 4, the first and second solar cells 151 and 152 are schematically shown mainly on the semiconductor substrate 160 and the electrodes 42 and 44.

As shown in FIG. 4, the wiring member 142 connects the first electrode 42 positioned on the front surface of the first solar cell 151 and the second electrode 44 positioned on the back surface of the second solar cell 152 positioned at one side (lower left of the drawing) of the first solar cell 151. Another wiring member 142 connects the second electrode 44 positioned on the back surface of the first solar cell 151 and the first electrode 42 positioned on the front surface of another solar cell to be positioned on another side (upper right of the drawing) of the first solar cell 151. Other wiring member 142 connects the first electrode 42 positioned on the front surface of the second solar cell 152 and the second electrode 44 positioned on the back surface of other solar cell to be positioned at one side (lower left of the drawing) of the second solar cell 152. Accordingly, the plurality of solar cells 150 can be connected to each other by the wiring member 142 to form one row. Hereinafter, the description of the wiring member 142 can be applied to all the wiring member 142 connecting two neighboring solar cells 150.

At this time, the plurality of wiring members 142 can be extended to be positioned along one direction (an x-axis direction in the drawing, a direction intersecting a first finger line (reference numeral 42a in FIG. 5, hereafter the same), or an extending direction of a first bus bar (reference numeral 42b in FIG. 5 hereafter the same)) on one surface of each solar cell 150 to improve electrical connection characteristics of neighboring solar cells 150.

In this embodiment, the wiring member 142 can be formed of a wire having a width smaller than that of a ribbon having a relatively wide width (for example, 1 mm to 2 mm) which has been used previously. For example, a maximum width of the wiring member 142 can be 1 um or less. Here, the maximum width of the wiring member 142 can mean a largest width among widths passing the center of the wiring member 142. When the wiring member 142 has such a maximum width, it can be smoothly attached to the solar cell 150 while the resistance of the wiring member 142 can be kept low and the optical loss can be minimized.

The number of the wiring members 142 can be greater than the number (for example, 2 to 5) of the conventional ribbons on the basis of one surface of each solar cell 150. Then, a movement distance of carriers can be reduced by a large number of the wiring member 142 while minimizing the optical loss and material cost by the wiring member 142 having a small width. Thus, the efficiency of the solar cell 150 and the output of the solar cell panel 100 can be improved by reducing the movement distance of the carriers while reducing the optical loss, and productivity of the solar cell panel 100 can be improved by reducing the material cost due to the wiring member 142.

Considering that the process of attaching the wiring member 142 to the solar cell 150 can be complicated when the number of the wiring member 142 having the small width is used in a large number, the wiring member 142 can have a structure including a core layer 142a and a solder layer 142b formed on the surface of the core layer 142a. Then, a large number of the wiring member 142 can be effectively attached by the process of applying heat and pressure while the wiring member 142 is placed on the solar cell 150.

The wiring member 142 or the core layer 142a, which occupies most of the wiring member 142, can include rounded portions. That is, at least a part of the cross section of the wiring member 142 or the core layer 142a can include a circle, a part of a circle, an ellipse, a part of an ellipse, or a part made of a curve.

If the wiring member 142 has such a shape, the wiring member 142 is formed in a structure in which the solder layer 142b is entirely positioned on the surface of the core layer 142a, the process of separately applying the solder material and the like are omitted, so that the wiring member 142 can be attached by positioning the wiring member 142 directly on the solar cell 150. Thus, the process of attaching the wiring member 142 can be simplified. In addition, light reflected by the wiring member 142 can be re-incident on the solar cell 150 by being reflected or diffused by the rounded portion of the wiring member 142, and reused. Accordingly, since the amount of light incident on the solar cell 150 is increased, the efficiency of the solar cell 150 and the output of the solar cell panel 100 can be improved. However, the embodiments of the present invention are not limited thereto. Therefore, the wire constituting the wiring member 142 can have a polygonal shape such as a quadrangle, or can have various other shapes.

At this time, the number of the wiring members 142 can be 5 to 33 (for example, 6 to 33, for example, 8 to 33, particularly 10 to 15), and the wiring members 142 can be spaced apart from each other at a uniform distance. The plurality of the wiring member 142 in each solar cell 150 can have a symmetrical shape when viewed in an extending direction of the first finger line 42a. Thus, a sufficient number of the wiring members 142 can be provided, and the movement distance of the carriers can be minimized.

In this embodiment, the wiring member 142 can include the core layer 142a made of metals and the solder layer 142b that is formed on the surface of the core layer 142a and includes solder material to enable soldering with the electrodes 42,44. That is, the solder layer 142b can serve as a kind of an adhesive layer. For example, the core layer 142a can include Ni, Cu, Ag, Al, or the like as a main material (for example, a material containing 50 wt % or more, or more specifically, a material containing 90 wt % or more). The solder layer 142b can include a solder material such as Pb, Sn, SnIn, SnBi, SnPb, SnPbAg, SnCuAg, SnCu, or the like as a main material. However, the embodiments of the present invention are not limited thereto, and the core layer 142a and the solder layer 142b can include various materials.

On the other hand, when the wiring member 142 is attached to the solar cell 150 by a tabbing process, as shown in FIG. 3, a shape of the solder layer 142b is changed in a portion of the wiring member 142 attached to or connected to the solar cell 150.

More specifically, the wiring member 142 is attached to at least pad portions 422 and 442 by the solder layer 142b. At this time, the solder layer 142b of each wiring member 142 is separately positioned with other wiring member 142 or solder layer 142b. When the wiring member 142 is attached to the solar cell 150 by the tabbing process, each solder layer 142b flows down to the first or second electrodes 42, 44 (more specifically, the pad portions 422 and 424) as a whole during the tabbing process, and a width of the solder layer 142b can gradually increase toward the pad portions 422, 442 at a portion adjacent to each pad portion 422, 442 or a portion positioned between the pad portions 422, 442 and the core layer 142a. As one example, the portion adjacent to the pad portions 422 and 442 in the solder layer 142b can have a width equal to or greater than a diameter of the core layer 142a. At this time, the width of the solder layer 142b can be equal to or less than a width of the pad portions 422, 442.

More specifically, the solder layer 142b has a shape protruding toward the outside of the solar cell 150 along the shape of the core layer 142a in an upper portion of the core layer 142a. On the other hand, the solder layer 142b includes a portion having a concave shape with respect to the outside of the solar cell 150 in a lower portion of the core layer 142a or a portion adjacent to the pad portions 422 and 442. As a result, an inflection point where the curvature changes is positioned on the side of the solder layer 142*b*. It can be seen that the wiring member 142 are individually attached and fixed by the solder layer 142*b* without being inserted or covered in a separate layer, film, or the like from this shape of the solder layer 142*b*. The solar cell 150 and the wiring member 142 can be connected by a simple structure and a process by fixing the wiring member 142 by the solder layer 142*b* without using a separate layer or a film. Particularly, the wiring member 142 having a narrow width and a rounded shape as in the present embodiment can be attached without using a separate layer, a film, (for example, a conductive adhesive film including a resin and a conductive material) or the like, so that the process cost and time of the wiring member 142 can be minimized.

At this time, a thickness of the solder layer 142*b* positioned between the pad portions 422 and 442 and the core layer 142*a* can be greater than a thickness of the solder layer 142*b* positioned on the portion opposite thereto (i.e., positioned toward the outside) in the portion of the wiring member 142 attached to the solar cell 150. This is because the solder layer 142*b* flows in the direction of the pad portions 422 and 442 during the tabbing process.

On the other hand, the portion of the wiring member 142 positioned between the neighboring solar cells 150 (i.e., outside the solar cell 150), which is not subjected to heat or is applied with relatively less heat even after the tabbing process, can have a shape as shown in FIG. 4. Accordingly, the description of these portions will be omitted.

According to the present embodiment, optical loss can be minimized by diffused reflection or the like using a wire-shaped wiring material 142, and it is possible to reduce the movement path of the carrier by increasing the number of the wiring member 142 and reducing a pitch of the wiring member 142. In addition, the width or diameter of the wiring member 142 can be reduced, so that the material cost can be greatly reduced. Accordingly, the efficiency of the solar cell 150 and the output of the solar cell panel 100 can be improved.

Figure 5:
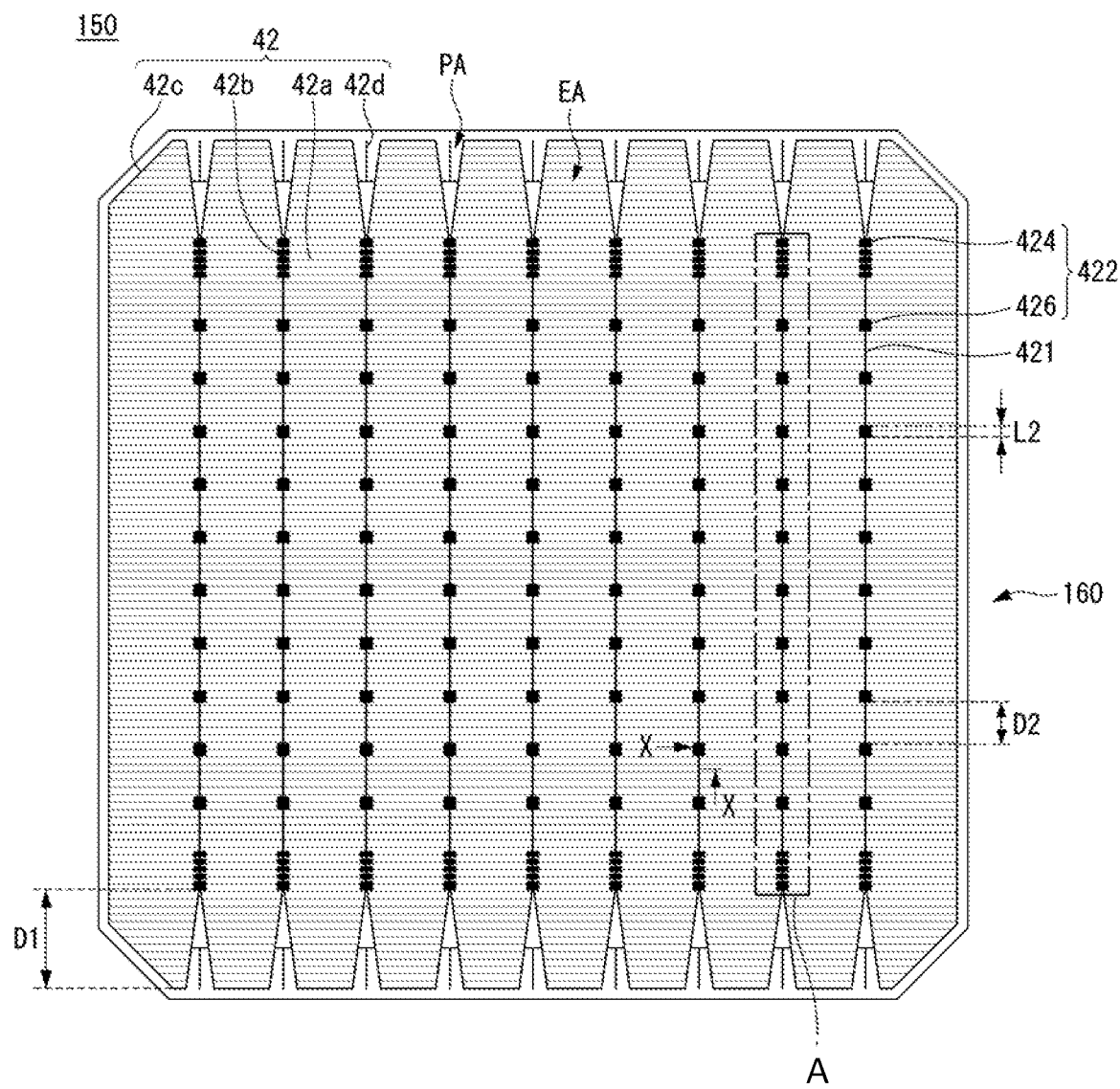
FIG. 5 is a front plan view of a solar cell shown in FIG. 4.

Referring to FIG. 5 with FIGS. 1 to 4, an example of the electrodes 42 and 44 of the solar cell 150 to which the wiring member 142 according to an embodiment of the embodiments of the present invention are attached will be described in detail. Hereinafter, with reference to FIG. 5 the first electrode 42 will be described in detail, and for the second electrode 44, the same or similar parts as the first electrode 42 and the different parts from the first electrode 42 will be described.

FIG. 5 is a front plan view of the solar cell 150 shown in FIG. 4. For reference, a shape of an outer pad 424 in FIG. 5 is shown schematically, and a specific shape of the outer pad 424 will be described later in more detail with reference to FIGS. 6 to 9.

Referring to FIGS. 1 to 5, in this embodiment, the first electrode 42 includes a plurality of first finger lines 42*a* being extended in a first direction (a horizontal direction in the drawing) and positioned parallel to each other, and a first bus bar 42*b* formed in a second direction (a longitudinal direction in the drawing) intersecting (for example, orthogonal) with the first finger line 42*a* and electrically connected to the first finger line 42*a* and connected or attached to the wiring member 142. In the drawing as shown, further formed is a rim line 42*c* that connects the ends of the plurality of first finger lines 42*a* as a whole in the vicinity of both side edges. The rim line 42*c* can have the same or similar width as the first finger line 42*a* and can be composed of the same material as the first finger line 42*a*. However, it is also possible not to include the rim line 42*c*.

At this time, in this embodiment, the solar cell 150 (or the semiconductor substrate 160) can be partitioned into an electrode area EA and an edge area PA. Here, the electrode area EA can be an area in which the first finger lines 42*a* formed in parallel to each other are arranged at a uniform pitch. The electrode area EA can include a plurality of electrode areas EA partitioned by the wiring member 142. The edge area PA is an area positioned between two adjacent electrode areas EA and positioned adjacent to an edge of the semiconductor substrate 160 or the solar cell 150 outside a plurality of first pad portions 422 (particularly, the outer pads 424). At this time, the edge area PA can be an area where an electrode portion 42*d* is positioned at a density lower than a density of the first finger line 42*a* of the electrode area EA, or an area where the electrode portion 42*d* is not positioned. In the drawing, the electrode portions 42*d* positioned on both sides of each other have the same shape. However, the embodiments of the present invention are not limited thereto, and various other modifications are possible.

In this embodiment, at least a portion of the plurality of first finger lines 42*a* include a contact portion which is in direct contact with the first conductive type region 20, and serve to collect carriers generated by the photoelectric conversion from the first conductive type region 20. In one example, the plurality of first finger lines 42*a* can be extended in parallel to each other and spaced apart from each other so as to have a constant pitch. In FIG. 5, the first finger lines 42*a* is extended in the minor axis direction and are parallel to each other and parallel to one edge of the semiconductor substrate 160.

In this embodiment, the first bus bar 42*b* can include the plurality of first pad portions 422 positioned in the second direction and can further include a first line portion 421 which is elongated with a relatively narrow width along a direction in which the wiring member 142 is connected. The first pad portion 422 can improve the adhesion with the wiring member 142 and reduce the contact resistance, and the first line portion 421 can minimize the optical loss. The first line portion 421 can provide a path through which the carrier can bypass when some of the first finger lines 42*a* are broken.

More specifically, the plurality of first pad portions 422 includes the outer pad 424 positioned to be adjacent to the edge of the semiconductor substrate 160 in the second direction, and an inner pad 426 positioned inside the outer pad. Here, the outer pad 424 can mean two pads positioned to be closest to each of the two side edges when viewed in the second direction among the plurality of first pad portions 422, and the inner pad 426 can mean a pad positioned between the two outer pads 424. Here, since the outer/inner reference is based only on the plurality of first pad portions 422, unlike the drawing, the first line portion 421 can be positioned outside the outer pad 424.

A width of the first pad portion 422 in the first direction can be greater than a width of the first line portion 421 in the first direction and a width of the first finger line 42*a* in the second direction, respectively. A length of the first pad portion 422 in the first direction can be greater than the width of the first line portion 421 in the first direction and the width of the first finger line 42*a* in the second direction, respectively. The width of the first line portion 421 can be equal to or less than a width of the wiring member 142 and the width of the first pad portion 422 can be equal to or greater than the width of the wiring member 142. As described above, if the first pad portion 422 has a sufficient width, the first pad portion 422 can improve the adhesion with the wiring member 142 and reduce the contact resistance. The width of the wiring member 142 can be less than a pitch of the first finger line 42a and can be greater than the width of the first finger line 42a. However, the embodiments of the present invention are not limited thereto and various modifications are possible.

At this time, a plurality of inner pads 426 can be arranged at a predetermined interval in each first bus bar 42b. For example, 6 to 40 inner pads 426 (e.g., 12 to 24) can be arranged in each first bus bar 42b. Here, each of the inner pads 426 can be positioned for each of the plurality of first finger lines 42a, and for example, a pitch of the inner pad 426 can be 2 to 20 times (e.g., 3 times or more, 10 times or less) the pitch of the first finger line 42a. However, the number, arrangement, and the like of the inner pads 426 can be variously modified. In FIG. 5, the inner pads 426 are spaced at equal intervals, but the embodiments of the present invention are not limited thereto. Therefore, the number and density of the inner pads 426 can be increased in a portion where a large force acts.

Figure 6:
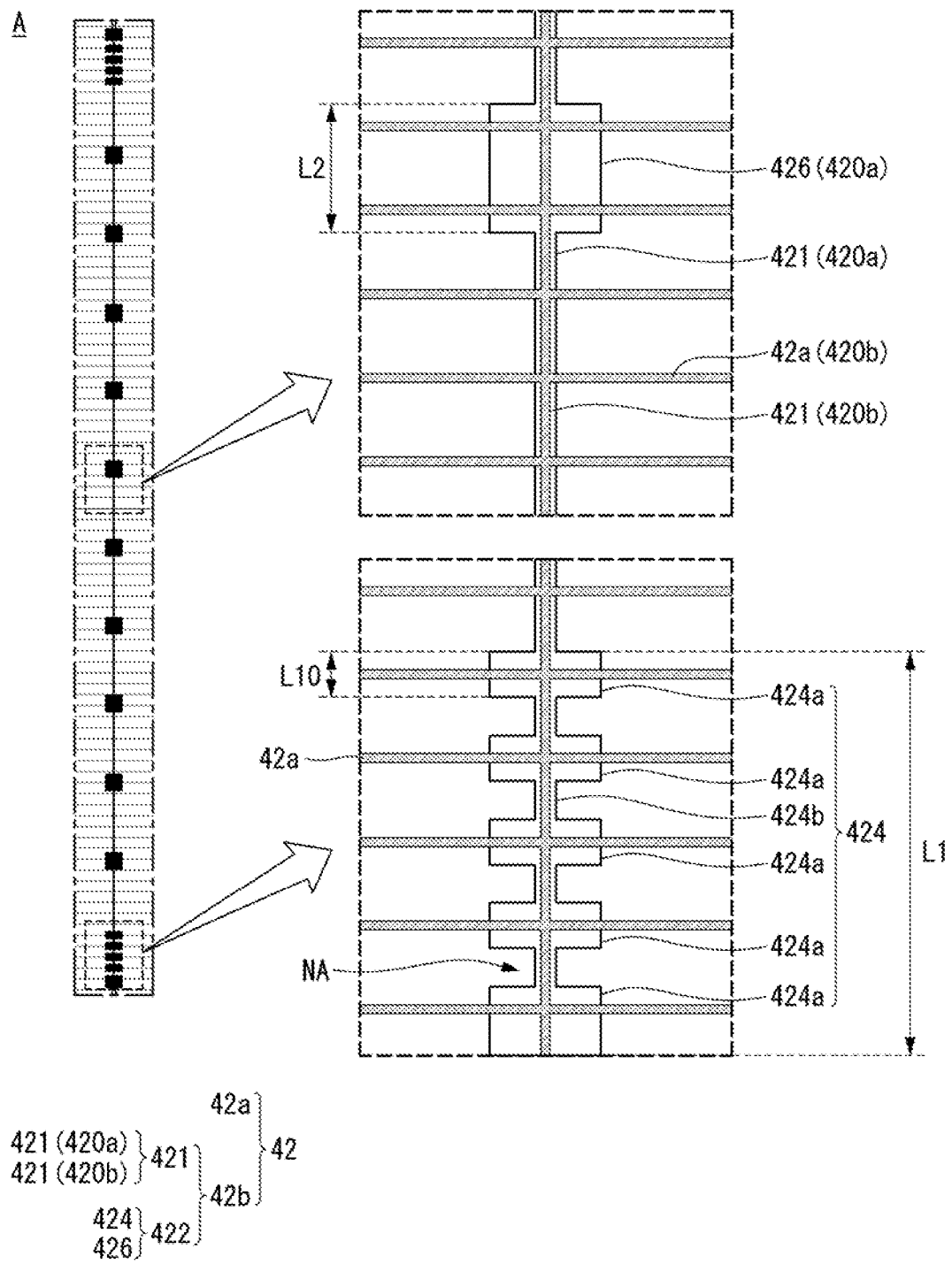
FIG. 6 is a partial front plan view showing an enlarged view of a portion A in FIG. 5.
Figure 7:
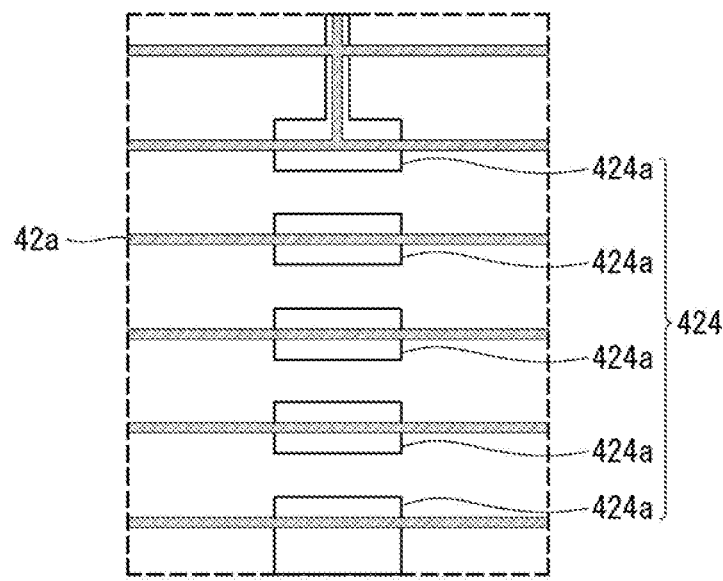
FIG. 7 is a partial front plan view showing a solar cell according to a modification of the present invention.
Figure 8:
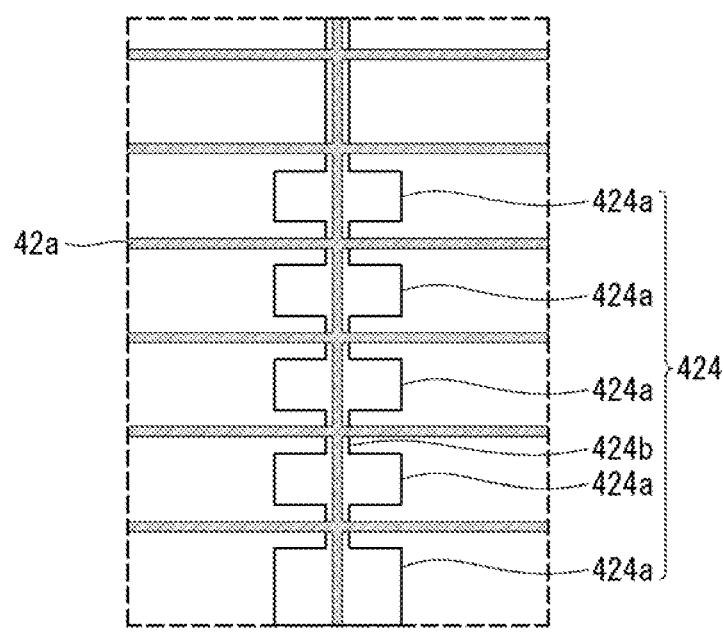
FIG. 8 is a partial front plan view showing a solar cell according to another modification of the present invention.
Figure 9:
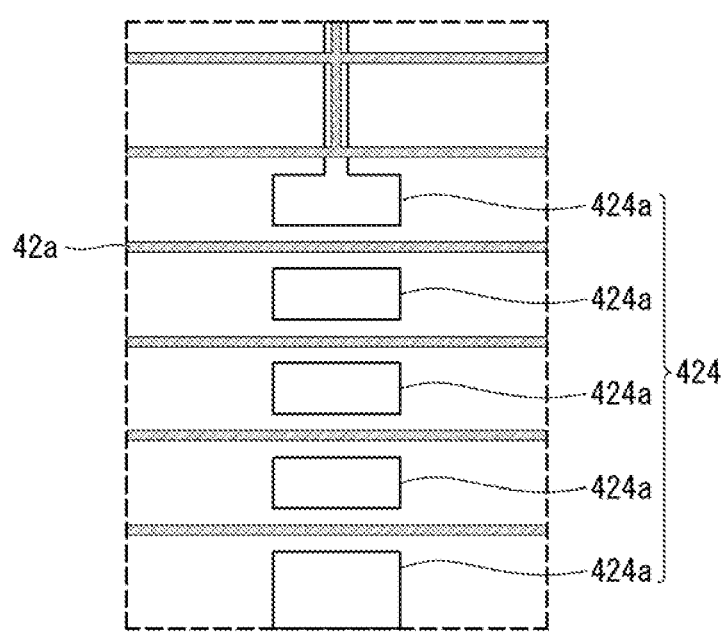
FIG. 9 is a partial front plan view showing a solar cell according to another modification of the present invention.

Referring to FIGS. 6 to 9 with FIG. 5, a specific structure of the outer pad 424 according to an embodiment and various modifications of the present invention will be described. FIG. 6 is a partial front plan view showing an enlarged view of a portion A in FIG. 5. FIGS. 7 to 9 are partial front plan views showing a solar cell according to various modified examples of the present invention.

Referring to FIGS. 5 to 9, in this embodiment, the outer pad 424 positioned at the edge of the semiconductor substrate 160 can have a lower adhesion force than the inner pad 426 and a total length L1 of the outer pad 424 can be greater than a length L2 of the inner pad 426. Here, the total length L1 of the outer pads 424 can mean a length between the both outer edges of the outer pads 424.

Here, an edge of the outer pad 424 adjacent to the edge of the semiconductor substrate 160 can be spaced a first distance D1 from an outermost first finger line 42a of the plurality of first finger lines 42a by the edge area PA, and the total length L1 of the outer pads 424 in the second direction can be equal to or less than the first distance D1. Alternatively, the total length L1 of the outer pads 424 can be less than or equal to 20 times the width of the wiring member 142. Accordingly, the total length L1 of the outer pads 424 is limited, so that the material cost, the shading area, and the like can be prevented from becoming excessively large as the length of the outer pad 424 increases. However, the embodiments of the present invention are not limited thereto. Therefore, the total length L1 of the outer pad 424 can be greater than the length of the first distance D1 or the edge area PA, or the edge area PA need not be provided. Alternatively, the total length L1 of the outer pads 424 can exceed 20 times the width of the wiring member 142.

At this time, in this embodiment, the outer pads 424 can include a dividing portion 424a having a non-forming portion NA having an interval or a length less than an average interval D2 of the plurality of inner pads 426 in the second direction, and spaced apart from each other.

At this time, a distance between dividing portions 424a or a length of the non-forming portion NA in the second direction can be less than or equal to three times the pitch of the first finger line 42a. In particular, the distance between the dividing portions 424a or the length of the non-forming portion NA can be less than or equal to one time the pitch of the first finger line 42a. That is, the distance between the dividing portions 424a or the length of the non-forming portion NA can be equal to or less than the pitch of the first finger line 42a. This is because the distance between the dividing portions 424a or the length of the non-forming portion NA is reduced while the dividing portions 424a constituting the outer pads 424 are formed with a sufficient length, so that excellent attachment characteristics with the wiring member 142 in the outer pad 424 is maintained.

At this time, as shown in FIGS. 6 and 7, the dividing portion 424a can be disposed so as to overlap the first finger line 42a. At this time, the dividing portion 424a is positioned one by one corresponding to the first finger lines 42a to improve the attachment characteristics with the wiring member 142. In a portion where each the dividing portion 424a is positioned, the first finger line 42a can be formed as a non-contact portion, thereby minimizing an area of a contact electrode where carriers can be recombined. This will be described in more detail later.

Alternatively, as shown in FIGS. 8 and 9, the dividing portion 424a need not overlap the first finger line 42a and can be positioned between the first finger lines 42a. At this time, the dividing portion 424a is positioned one by one between the two first finger lines 42a, and the attachment characteristics with the wiring member 142 can be greatly improved. However, the embodiments of the present invention are not limited thereto, and the dividing portion 424a can have a different arrangement.

At this time, as shown in FIGS. 6 and 8, a connecting portion 424b connecting the plurality of dividing portions 424a in the second direction can further be included. FIGS. 6 and 8 illustrate that the connecting portion 424b is a portion constituting a part of the first line portion 421 or a portion being extended to be parallel to the first line portion 421. However, the embodiments of the present invention are not limited thereto, and the connecting portion 424b can be positioned to connect a position (for example, one side or both side edges of the dividing portion 424a in the first direction) different from the first line portion 421 in the first direction. Alternatively, as shown in FIGS. 7 and 9, the plurality of dividing portions 424a can be positioned apart from each other. Various other modifications are possible.

In this embodiment, at least some of the dividing portions 424a can have a size equal to or greater than the inner pad 426. More specifically, a length L10 of at least some of the dividing portions 424a can be equal to or greater than the length L2 of the inner pad 426 in the second direction. Then, the attachment characteristics with the wiring member 142 can be improved by the relatively large-sized dividing portion 424a. Alternatively, at least some of the dividing portions 424a can have a size less than the inner pad 426 in the second direction. More specifically, the length L10 of at least some of the dividing portions 424a can be less than the length L2 of the inner pad 426. Then, while an area of the first electrode 42 is minimized by the small-sized dividing portions 424a, excellent attachment characteristics of the wiring member 142 can be maintained by the plurality of dividing portions 424a.

At this time, as shown in FIGS. 6 to 9, the outermost one of the plurality of dividing portions 424a can have the smallest size. Various other modifications are possible. As one example, the outermost one of the plurality of dividing portions 424a can have the largest size. As another example, the sizes of the plurality of dividing portions 424a can be equal to each other. As another example, the plurality of dividing portions 424a having different sizes are included, and the arrangement thereof can be variously modified.

Here, the sizes of the inner pad 426 and the dividing portions 424a can be different depending on a length in the second direction. Since the widths of the inner pad 426 and the dividing portions 424a are substantially the same (for example, an error of 10% or less), the size is adjusted by the length difference in order to stably attach the wiring member 142 and reduce the area of the first electrode 42.

Figure 10:
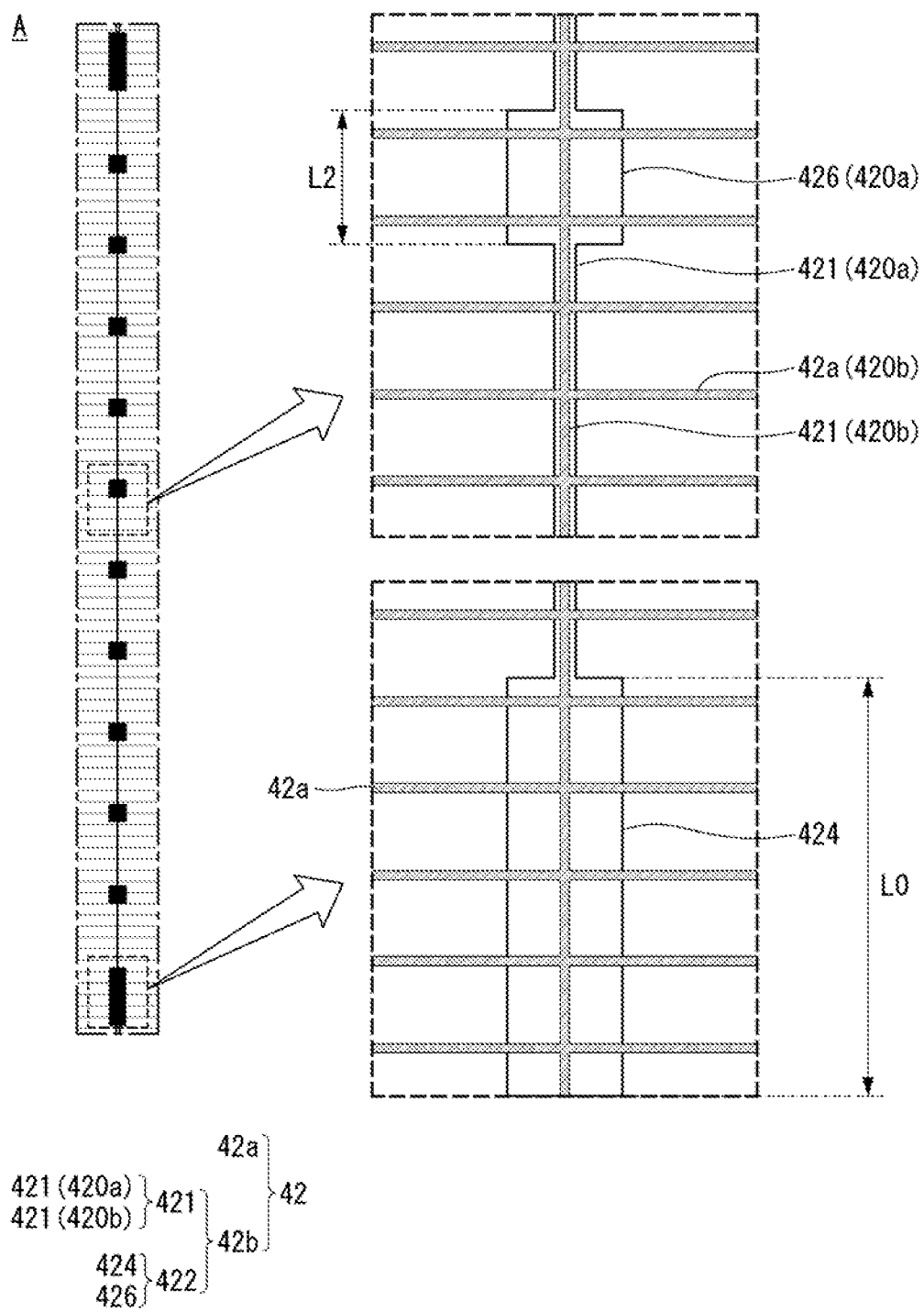
FIG. 10 is a partial front plan view showing a solar cell according to another modification of the present invention.

In the above-described embodiment, each of the outer pads 424 has the plurality of dividing portions. As another modification, as shown in FIG. 10, the outer pad 424 can be composed of a single portion having a length L0 that is longer than the length L2 of the inner pad 426. Accordingly, the outer pad 424 is formed to have a sufficient area to maximize the area of the wiring member 142 to be attached, thereby greatly improving the attachment characteristics of the wiring member 142 on the outer pad 424.

In FIGS. 6 and 10, the length L2 of the inner pad 426 is greater than the pitch of the first finger line 42a, so that the inner pad 426 has a portion overlapping at least one first finger line 42a. As one example, the length L2 of the inner pad 426 is greater than the pitch of the first finger line 42a, so that the inner pad 426 has a portion overlapping at least two first finger lines 42a.

Figure 11:
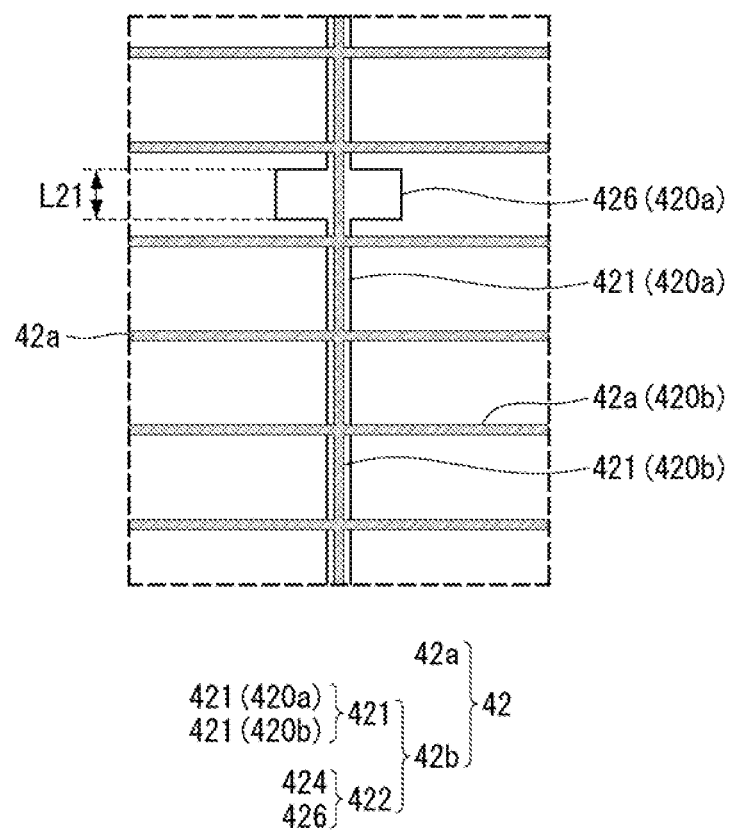
FIG. 11 is a partial front plan view showing a solar cell according to another modification of the present invention.

However, the embodiments of the present invention are not limited thereto. One modification will be described with reference to FIG. 11. FIG. 11 is a partial plan view showing a part of a solar cell according to another modification of the present invention. FIG. 11 shows only the part corresponding to an enlarged view including the inner pad 426 in FIG. 6 and FIG. 10.

As shown in FIG. 11, a length L21 of the inner pad 426 can be less than the pitch of the first finger line 42a and the inner pad 426 can be positioned between the two adjacent first finger lines 42a. According to this, the attachment area with the wiring member 142 can be sufficiently implemented by the inner pad 426 and the first finger line 42a while reducing the size of the inner pad 426, so that the attachment characteristics of the wiring member 142 can be improved while reducing the material cost. In another modification, the inner pad 426 can include a portion overlapping one first finger line 42a while the length L21 of the inner pad 426 is less than the pitch of the first finger line 42a. Then, a contact area of the first finger line 42a contacting the first conductive type region 20 can be minimized while reducing the size of the inner pad 426.

The inner pad 426 can be used in combination with the outer pad 424 having various structures shown in FIGS. 6 to 10.

In this embodiment, the plurality of first pad portions 422 of the first bus bar 42b have a different material, a different composition, or a multi-layered structure that is different from that of the plurality of first finger lines 42a, and can be spaced apart from the first conductive type region 20. That is, in this embodiment, the plurality of first pad portions 422 can include non-contact portions that are not in contact with the first conductive type region 20. This will be described in detail with reference to FIGS. 1 to 11 and 12 together.

Figure 12:
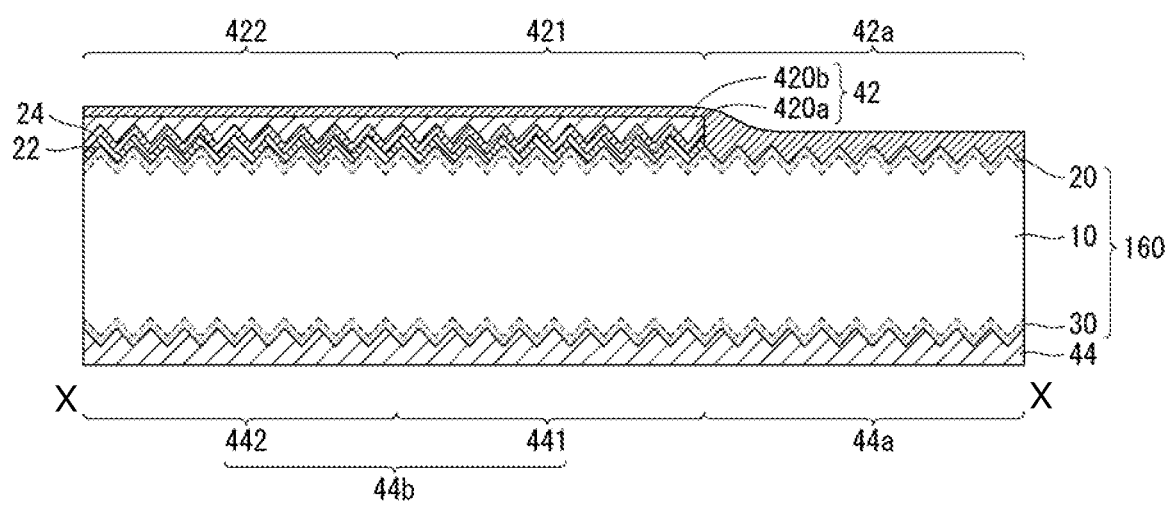
FIG. 12 is a schematic cross-sectional view taken along a line X-X in FIG. 5.

FIG. 12 is a schematic cross-sectional view taken along the line X-X in FIG. 5.

In this embodiment, the first finger line 42a should have good electrical contact characteristics with the semiconductor substrate 160 or the first conductive type region 20 in order to collect the carriers effectively. On the other hand, since the first bus bar 42b or the first pad portion 422 only needs to provide a region to which the wiring member 142 is attached, the collection of the carriers directly from the semiconductor substrate 160 or the first conductive type region 20 need not necessarily be performed. Accordingly, in this embodiment, at least part of the first finger line 42a is composed of a contact electrode which is in contact with the first conductive region 20 through a first insulating layer, and the first pad portion 422 is composed of a non-contact electrode spaced apart from the first conductive type region 20 with the first insulating layer therebetween. The first line portion 421 can be composed of a contact electrode having a portion in direct contact with the first conductive type region 20 and a non-contact electrode positioned to be spaced apart from the first conductive type region 20.

If the first pad portion 422 is not in contact with the first conductive type region 20 as described above, the area of the first electrode 42 contacting the first conductive type region 20 can be minimized. This can minimize passivation characteristic degradation or carrier recombination that can occur at a portion where the first conductive type region 20 and the first electrode 42 are in contact with each other. Accordingly, an open voltage of the solar cell 150 can be improved to improve the efficiency. In particular, as in the present embodiment, a large effect can be obtained in the solar cell 150 including a large number of narrow width wiring members 142 and accordingly a large number of first pad portions 422. The appearance or aesthetics can be improved by the shape of the first pad portion 422. In various embodiments, a plan outline of the first pad portion 422 can be rectangular, but such is not required. In other embodiments, the plan outline of the first pad portion 422 can be curved, a polyhedron, oval, circular, or any other shapes, including having internal spaces or perforations.

As described above, the first pad portions 422 can have a different material, a different composition, or a multi-layered structure that is different from that of the first finger lines 42a in order to form the first finger line 42a as a contact electrode and to form the first pad portion 422 as a non-contact electrode. That is, the first pad portion 422 can be positioned on the first insulating layer without passing through the first insulating layer. Accordingly, the first finger line 42a can include a layer having a material or composition capable of passing through the first insulating layer, and the first pad portion 422 can include a layer having a material or composition that does not need to pass through the first insulating layer.

For example, the first finger line 42a, the first pad portion 422, and the first line portion 421 having a constant pattern can be formed by performing a firing heat treatment after printing the paste. Then, the first finger line 42a and the first pad portion 422 having a pattern can be easily formed by a simple process.

More specifically, in this embodiment, a layer (for example, a first layer 420a) constituting at least a part of the first pad portion 422 can be formed before a layer (for example, a second layer 420b) forming the first finger line 42a. Accordingly, a part of the plurality of first finger lines 42a can be positioned on the first pad portion 422. That is, the plurality of first finger lines 42a can include a non-contact portion that is spaced apart from the first conductive type region 20 with the first insulating layer and the first pad portion 422 therebetween at a portion overlapping the first pad portion 422.

For example, in the present embodiment, the first electrode 42 can be formed by performing a firing heat treatment together after printing a second paste forming at least the first finger line 42a after first printing and drying a first paste forming at least part of the first pad portion 422. This prevents the shape of the first finger line 42a from being undesirably changed or prevents the first finger line 42a from being undesirably spread or collapsed during the manufacturing process. On the contrary, if the second paste for the first finger line 42a is first printed and dried, and then the first paste for the first pad portion 422 is printed and then subjected to the firing heat treatment together, there arises a problem that the first finger line 42a having a small width spreads widely or is crushed at a portion where the first pad portion 422 is formed when the second paste is formed. As described above, this problem can be more serious when the thickness of the first finger line 42a is equal to or greater than the thickness of the first pad portion 422.

When the first line portion 421 is constituted as a contact electrode, the first line portion 421 can have the same material, composition, or multi-layered structure as the first finger line 42a. On the contrary, when the first line portion 421 is constituted as a non-contact electrode, the first line portion 421 can have the same material, composition, or multi-layered structure as the first pad portion 422, or a multi-layered structure in which the first finger line 42a is positioned on the first pad portion 422.

For example, in this embodiment, the first pad portion 422 can include the first layer 420a formed on the first insulating layer and not in contact with the first conductive type region 20, and the first finger line 42a can include the second layer 420b in contact with the first conductive region 20 passing through the first insulating layer and positioned on the first layer 420a. The first line portion 421 can include the first layer 420a and the second layer 420b positioned on the first layer 420a.

That is, the first layer 420a is first formed on a portion where the first pad portion 422 and the first line portion 421 are to be formed, and the second layer 420b is formed on a portion where the first line portion 421 and the first finger line 42a are to be formed. When the second layer 420b is formed, the first finger line 42a can be formed to be extended in the first direction, and the first line portion 421 can have a shape elongated in the second direction so as to connect the plurality of first finger lines 42a. Accordingly, the first finger line 42a is formed as a contact portion which is in direct contact with the first conductive region 20 in a portion where the first pad portion 422 or the first layer 420a is not formed, and a non-contact portion which is spaced apart from the first conductive type region 20 with the first pad portion 422 or the first layer 420a therebetween in a portion formed on the first pad portion 422 or the first layer 420a. According to the present embodiment, the first line portion 421 having a width smaller than that of the wiring members 142 having a small width includes both the first layer 420a and the second layer 420b, thereby greatly improving the electrical characteristics. Also, the first finger line 42a can be extended to have the contact portion and the non-contact portion, and can be stably connected to the first pad portion 422.

At this time, the second paste for forming the first finger line 42a or the second layer 420b can be formed of a material or composition that is fired-through passing through the first insulating layer during the heat treatment, and the first paste for forming the first pad portion 422 or the first layer 420a can be formed of a material or composition that is not fired-through during the heat treatment. Then, an opening can be formed in a portion corresponding to the contact portion of the first finger line 42a by a process of heat-treating the second paste without separately performing a step of forming openings in the first insulating layer. Thus, the process of electrically and physically forming the first electrode 42 in the first conductive type region 20 can be simplified.

As an example, the second paste for forming the first finger line 42a or the second layer 420b and the first paste for forming the first pad portion 422 or the first layer 420a can include conductive powder (more specifically, metal powder), glass frit, organic binder, solvent, and the like. In addition, the first and second pastes can further include various additives such as a dispersing agent, a thixotropic agent and the like. During the heat treatment, most of the organic binder, solvent, and the like are removed, and the conductive powder, glass frit, and the like can remain in the second layer 420b and the first layer 420a.

For example, the first finger line 42a (or the second layer 420b) and the first pad portion 422 (or the first layer 420a) can include the same conductive material (for example, the same metal, as one example, silver (Ag)) so as to have the same or similar characteristics, thereby preventing a problem of using a different material. Instead, the first paste can include a glass frit capable of fire-through passing through the insulating layer by the heat treatment, and the second paste can include a glass frit that is not fired-through, unlike the glass frit of the first finger line 42a, not include the glass frit, or include less glass frit than the first paste.

As one example, an amount of lead (Pb) or bismuth (Bi) in the first finger line 42a or the second layer 420b can be greater than an amount of lead or bismuth in the first pad portion 422 or the first layer 420a. Here, the lead or bismuth is added in the form of lead oxide or bismuth oxide as part of the glass frit included in the first or second paste. Such lead oxide or bismuth oxide is a substance that contributes to forming an opening passing through the insulating layer by the fire-through at the time of firing the first paste by the heat treatment. Accordingly, the first paste forming the first finger line 42a or the second layer 420b, which needs to form the opening, can include a relatively large amount of lead oxide or bismuth oxide, so that fire-through can be smoothly performed, and the second paste forming the first pad portion 422 or the first layer 420a, which does not need to form the opening, can include relatively less lead oxide or bismuth oxide. Accordingly, the amount of lead or bismuth of the first finger line 42a or the second layer 420b can be greater than the amount of lead or bismuth of the first pad portion 422 or the first layer 420a. However, the embodiments of the present invention are not limited thereto, and the kind and amount of glass frit, lead, etc. can be variously changed.

The content of the conductive material of the first pad portion 422 or the first layer 420a can be less than the content of the conductive material of the first finger line 42a or the second layer 420b. Since the first finger line 42a or the second layer 420b is in direct contact with the first conductive type region 20 to collect the carrier, the content of the conductive material can be relatively increased to secure electrical characteristics. Since the first pad portion 422 or the second layer 420b is not burdened with an increase in resistance, the content of the conductive material can be relatively less and the material cost can be reduced.

In the above description, printing is exemplified, but the embodiments of the present invention are not limited thereto. Therefore, it is also possible to form the first finger line 42a and the first pad portion 422 by different processes. That is, the first finger line 42a can be formed by a printing process, and the first pad portion 422 can be formed by a plating process, a sputtering process, a deposition process, or the like.

In the above description, the first electrode 42 is mainly described. The second electrode 44 can include a second finger line 44a corresponding to the first finger line 42a of the first electrode 42, and include a second pad portion 442, a second line portion 441, or a second bus bar 44b corresponding to the first pad portion 422, the first line portion 421, or the first bus bar 42b, respectively. The width, number, size, width, and the like of the finger lines 42a and 44a and the line portions 421 and 441 and the pad portions 422 and 442 of the bus bars 42b and 44b can be the same or different from each other in the first electrode 42 and the second electrode 44. The second electrode 44 can further include a rim line and/or an electrode portion corresponding to the rim line 42c and/or the electrode portion 42d of the first electrode 42.

If there is no other description, the content of the first electrode 42 can be applied to the second electrode 44 as it is, and the content of the first insulating layer in relation to the first electrode 42 can be directly applied to a second insulating layer in relation to the second electrode 44. At this time, the width, pitch, thickness, etc. of the first finger line 42a, the first pad portion 422, and the first line portion 421 of the first electrode 42 can be the same as or different from the width, pitch, thickness, etc. of the second line 44a, the second pad portion 442 and the second line portion 441 of the second electrode 44. A description of the outer pad 424 including the inner pad 426 and the plurality of dividing portions 424a can be applied to an inner pad and an outer pad of the second electrode 44. For example, a total length of the outer pad of the second electrode 44 can be equal to or greater than the total length L1 of the outer pad 424 of the first electrode 42.

For example, in this embodiment, the second finger line 44a and the second bus bar 44b (i.e., the second pad portion and/or the second line portion) of the second electrode 44 can be formed to be in contact with the second conductive type region 30 passing through the second insulating layer (for example, the second passivation layer 32). That is, the finger line 44a and the second bus bar 44b of the second electrode 44 can be formed as a contact electrode formed to be in contact with the second conductive type region 30 as a whole, and need not include a non-contact electrode. For example, the second electrode 44 can be formed of the same material and/or composition as the second layer 420b of the first electrode 42 as a whole. Accordingly, the second pad portion 442 and the second finger line 44a can have the same material and/or composition. In the back surface of the semiconductor substrate 160, on which light is relatively less incident, and/or the conductive type region (for example, the second conductive type region 30) serving as the electric field region with the same conductive type as the base region 10, the problem caused by the degradation of the passivation characteristics due to the contact electrode can be relatively small. In consideration of this, the second electrode 44 can be formed as a contact electrode as a whole to reduce the material cost and simplify the process, thereby improving the productivity.

However, the embodiments of the present invention are not limited thereto, and similarly to the first electrode 42, the second finger line 44a of the second electrode 44 can be composed of the contact electrode or the second layer constituting the contact electrode, and at least some (for example, the plurality of second pad portions 442) of the second bus bars 44b can be composed of the non-contact electrode or the first layer constituting the non-contact electrode. At this time, the second finger line 44a or the second layer included therein and the first finger line 42a or the second layer 420b included therein can have the same material, composition, or multi-layered structure, or can have a different material, a different composition, or a different multi-layered structure. Similarly, the second pad portion 442 or the first layer included therein and the first pad portion 422 or the first layer 420a included therein can have the same material and/or composition, or can have a different material, and/or a composition. In this instance, the second pad portion 442 or the first layer included therein and the second finger line 44a or the second layer included therein can have a different material, and/or a composition. In addition, the second electrode 44 can have a different shape from the first electrode 42, and various other modifications are possible.

According to the present embodiment, the first electrode 42 includes the first finger line 42a constituted as the contact electrode and the plurality of first pad portions 422 constituted as the non-contact electrode, so that it is possible to sufficiently secure the movement path of the carrier while reducing the contact area between the first electrode 42 and the first conductive type region 20. Accordingly, the open voltage, the current density and the like of the solar cell 150 can be increased to improve the efficiency of the solar cell 150, and the output of the solar cell panel 100 can be improved. At this time, when the wiring member 142 having a small width or a rounded shape is applied by the plurality of dividing portions 424a, it is possible to prevent deterioration of the attachment characteristics of the wiring member 142 that can occur at a portion adjacent to the edge of the solar cell 150. Further, even when a large number of wiring member are used by the plurality of dividing portions 424a, the amount of the material of the first electrode 42 and the area (particularly, the area in contact with the first conductive type region 20) of the first electrode 42 can be reduced to improve the characteristics and simplify the manufacturing process.

Hereinafter, a solar cell according to another embodiment of the present invention and a solar cell panel including the same will be described in detail. Detailed descriptions will be omitted for the same or extremely similar parts as those described above, and only different parts will be described in detail. It is also within the scope of the present invention to combine the above-described embodiments or variations thereof with the following embodiments or modifications thereof.

In the following description and drawings, the first electrode 42 is mainly described and shown. As described above, the second electrode 44 can be formed as the contact electrode as a whole to reduce the material cost, simplify the process, and improve the productivity. However, the embodiments of the present invention are not limited thereto, and a structure to be described later can be applied to at least one of the first and second electrodes 42 and 44. The description of the first conductive type region 20 and the first insulating layer in relation to the first electrode 42 in the following description can be applied as it is to the second conductive type region 30 and the second insulating layer in relation to the second electrode 44 in the instance of the second electrode 44.

Figure 13:
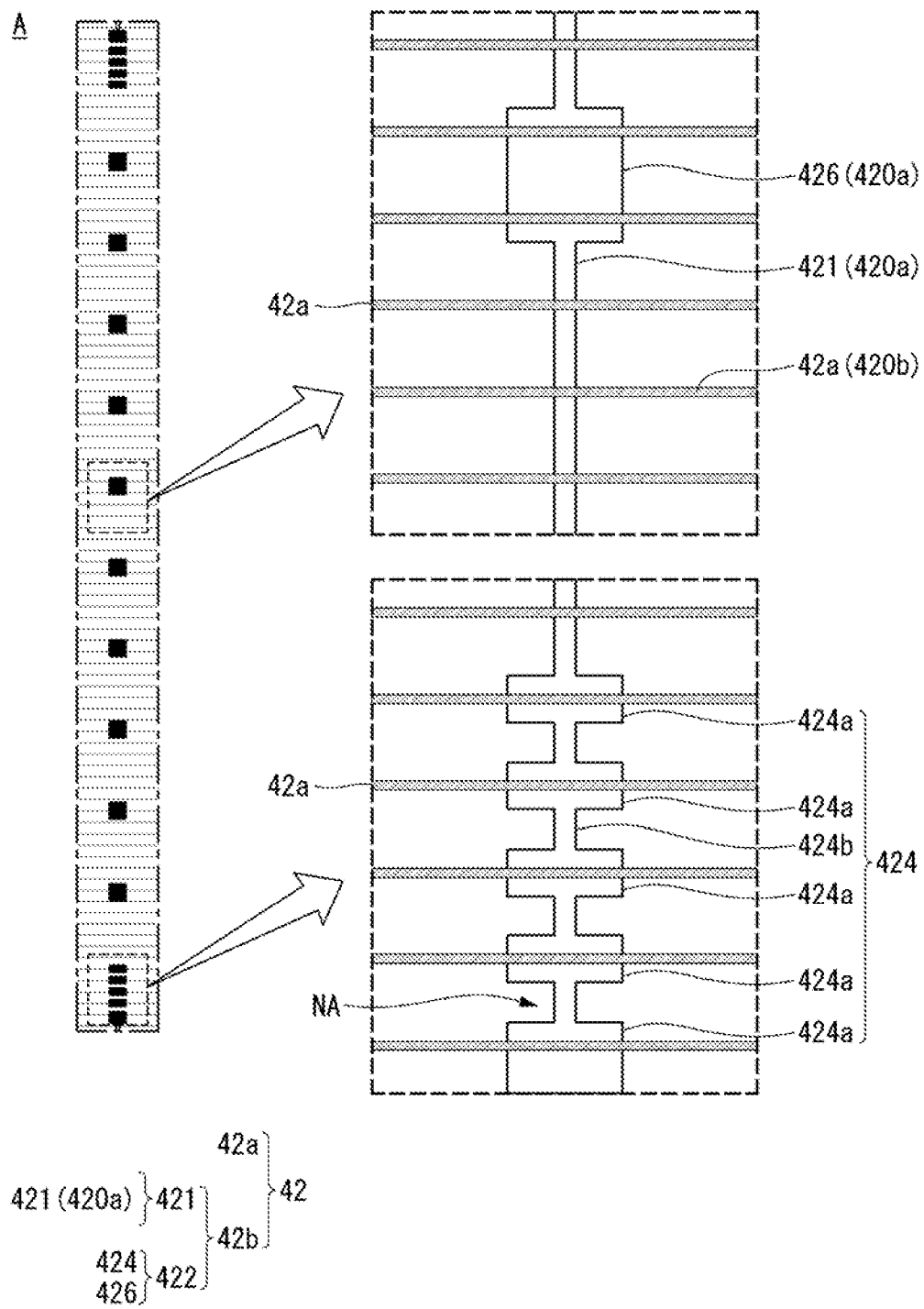
FIG. 13 is a partial front plan view showing a solar cell according to another embodiment of the present invention.
Figure 14:
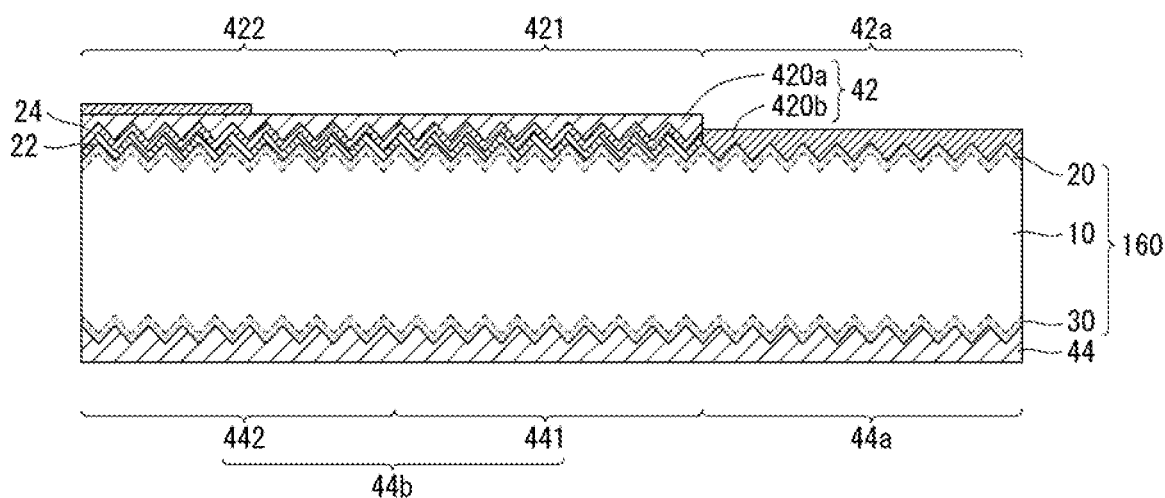
FIG. 14 is a schematic cross-sectional view of a solar cell shown in FIG. 13.

FIG. 13 is a partial front plan view showing a solar cell according to another embodiment of the present invention, and FIG. 14 is a schematic cross-sectional view of the solar cell shown in FIG. 13. FIG. 13 shows a portion corresponding to FIG. 6 for the sake of simplicity and clear illustration, and FIG. 14 shows a portion corresponding to FIG. 12.

Referring to FIGS. 13 and 14, in this embodiment, the first pad portion 422 can include the first layer 420a formed on the first insulating layer and not in contact with the first conductive type region 20, and the first finger line 42a can include the second layer 420b in contact with the first conductive region 20 passing through the first insulating layer and positioned on the first layer 420a. The first line portion 421 can include the same first layer 420a as the first pad portion 422 and can be positioned on the same plane as the first pad portion 422 and can have an integrated structure with the first pad portion 422. At this time, a connecting portion 424*b* connecting the plurality of dividing portions 424*a* in the second direction can be further included. It is illustrated that the connecting portion 424*b* is a portion constituting a part of the first line portion 421 or a portion being extended to be parallel to the first line portion 421.

That is, the first layer 420*a* is first formed on a portion where the first pad portion 422 and the first line portion 421 are to be formed, and the second layer 420*b* is formed on a portion where the first finger line 42*a* are to be formed. When the second layer 420*b* is formed, the first finger line 42*a* can be formed to be extended in the first direction. Accordingly, the first finger line 42*a* can be formed as a contact portion which is in direct contact with the first conductive region 20 in a portion where the first pad portion 422 or the first layer 420*a* is not formed, and a non-contact portion which is spaced apart from the first conductive type region 20 with the first pad portion 422 or the first layer 420*a* therebetween in a portion formed on the first pad portion 422 or the first layer 420*a*.

According to the present embodiment, the first line portion 421 having a small width can be formed as the first layer 420*a* in the same manner as the first pad portion 422, thereby improving the structural stability. Also, the first finger line 42*a* can be extended to have the contact portion and the non-contact portion, and can be stably connected to the first pad portion 422.

Figure 15:
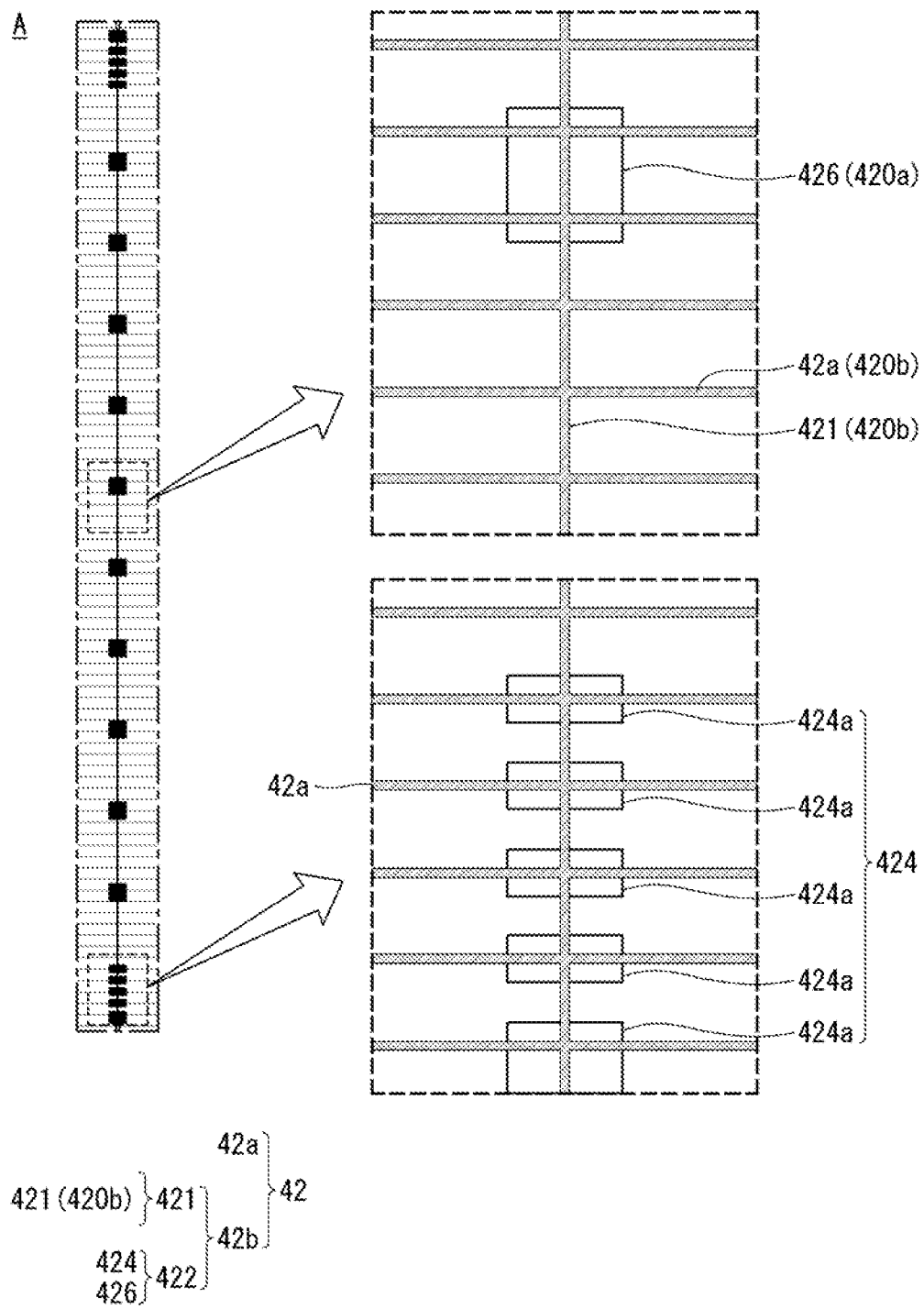
FIG. 15 is a partial front plan view showing a solar cell according to another embodiment of the present invention.
Figure 16:
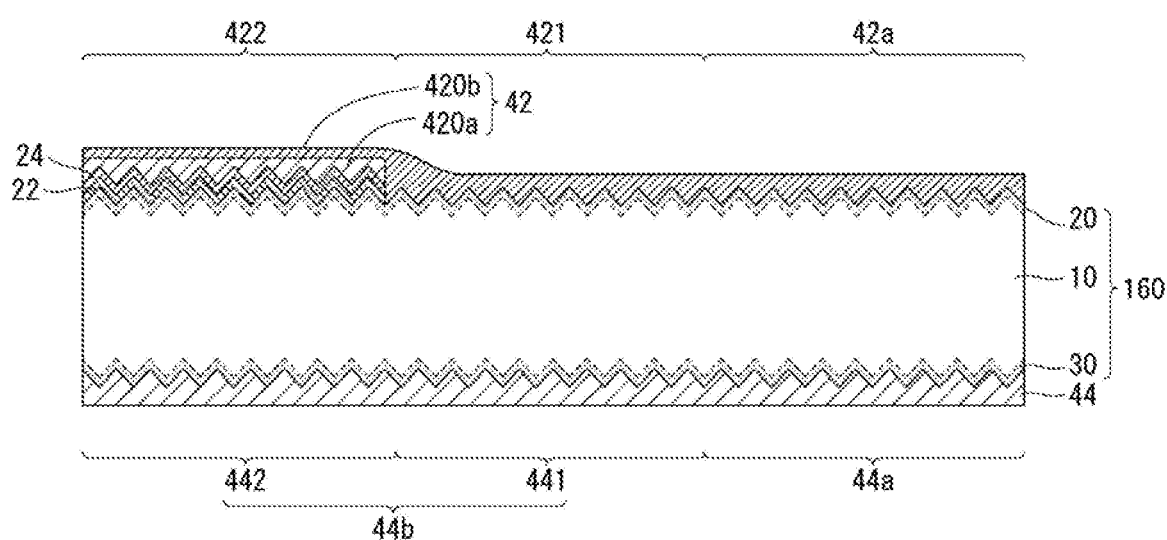
FIG. 16 is a schematic cross-sectional view of a solar cell shown in FIG. 15.

FIG. 15 is a partial front plan view showing a solar cell according to another embodiment of the present invention, and FIG. 16 is a schematic cross-sectional view of the solar cell shown in FIG. 15. FIG. 15 shows a portion corresponding to FIG. 6 for the sake of simplicity and clear illustration, and FIG. 16 shows a portion corresponding to FIG. 12.

Referring to FIGS. 15 and 16, in this embodiment, the first pad portion 422 can include the first layer 420*a* formed on the first insulating layer and not in contact with the first conductive type region 20, and the first finger line 42*a* can include the second layer 420*b* in contact with the first conductive region 20 passing through the first insulating layer and positioned on the first layer 420*a*. The first line portion 421 can include the same second layer 420*b* as the first finger line 42*a* and can be positioned on the same plane as the first finger line 42*a* and can have an integrated structure with the first finger line 42*a*. At this time, the first line portion 421 can further include a connecting portion connecting the plurality of dividing portions 424*a* in the second direction.

That is, the first layer 420*a* is first formed on a portion where the first pad portion 422 is to be formed, and the second layer 420*b* is formed on a portion where the first line portion 421 and the first finger line 42*a* are to be formed. When the second layer 420*b* is formed, the first finger line 42*a* can be formed to be extended in the first direction, and the first line portion 421 can have a shape elongated in the second direction so as to connect the plurality of first finger lines 42*a*. Accordingly, the first finger line 42*a* is formed as a contact portion which is in direct contact with the first conductive region 20 in a portion where the first pad portion 422 or the first layer 420*a* is not formed, and a non-contact portion which is spaced apart from the first conductive type region 20 with the first pad portion 422 or the first layer 420*a* therebetween in a portion formed on the first pad portion 422 or the first layer 420*a*. The first line portion 421 is formed as a contact portion which is in direct contact with the first conductive region 20 in a portion where the first pad portion 422 or the first layer 420*a* is not formed, and a non-contact portion which is spaced apart from the first conductive type region 20 with the first pad portion 422 or the first layer 420*a* therebetween in a portion formed on the first pad portion 422 or the first layer 420*a*.

According to the present embodiment, the first line portion 421 having a small width can be formed as the second layer 420*b* in the same manner as the first finger line 42*a*, and at least a part of the first line portion 421 can be formed as a contact portion, so that the carrier can be directly collected by the first line portion 421. Thus, the carrier collection efficiency can be improved.

Figure 17:
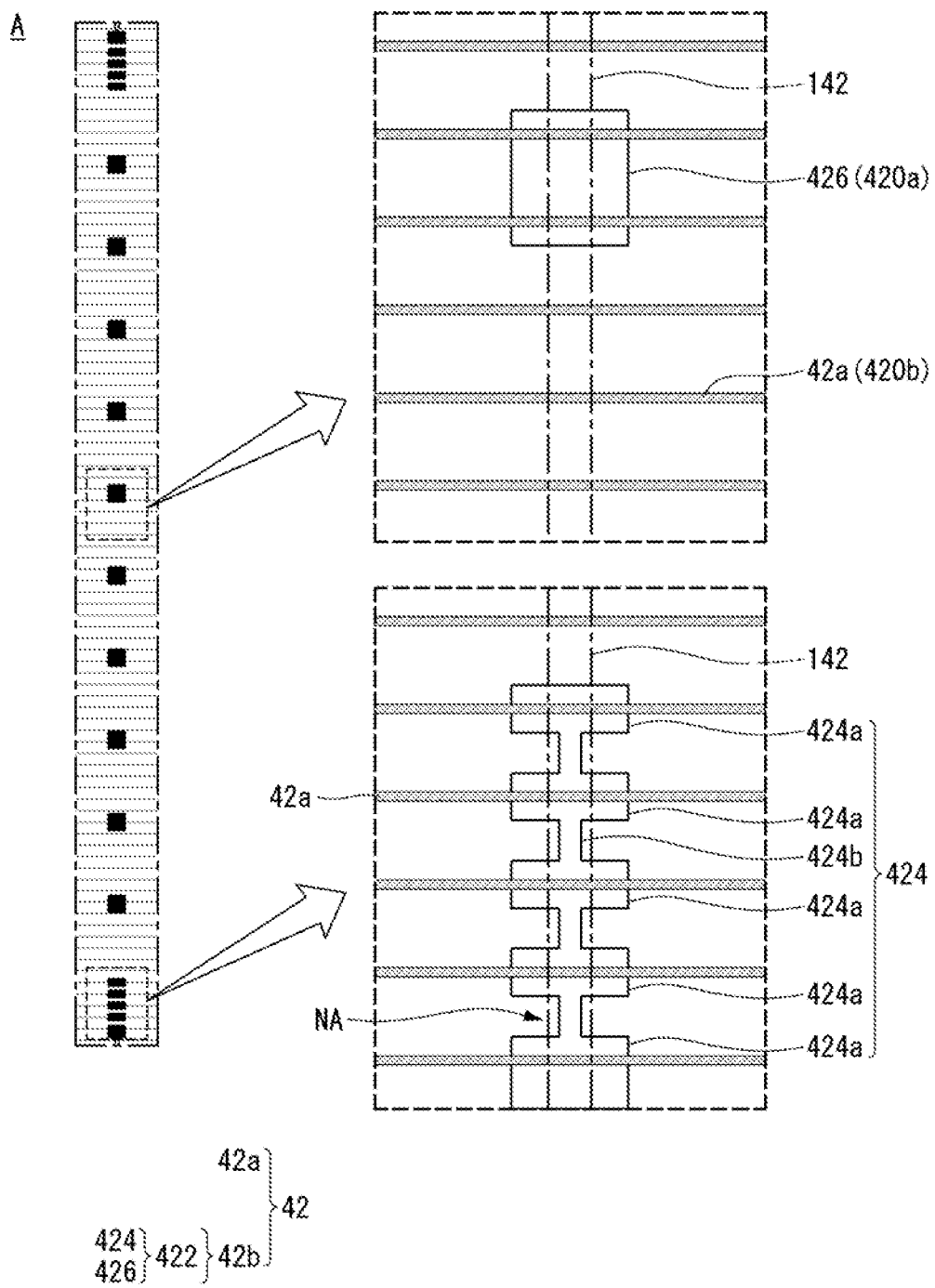
FIG. 17 is a partial front plan view showing a solar cell according to another embodiment of the present invention.

FIG. 17 is a partial front plan view showing a solar cell according to another embodiment of the present invention. An enlarged view of FIG. 17 shows a portion corresponding to FIG. 6 for the sake of simplicity and clear illustration, and FIG. 17 shows the wiring member 142 to be attached to the solar cell together with an alternate long and short dash line.

Referring to FIG. 17, in this embodiment, the first pad portion 422 can include the first layer 420*a* formed on the first insulating layer and not in contact with the first conductive type region 20, and the first finger line 42*a* can include the second layer 420*b* in contact with the first conductive region 20 passing through the first insulating layer and positioned on the first layer 420*a*. At this time, the plurality of first pad portions 422 (particularly, the first inner pad 426) are spaced from each other in the second direction, and a separate first line portion for connecting the first pad portions 422 is not provided. That is, the first layer 420*a* is first formed on a portion where the first pad portion 422 is to be formed, and the second layer 420*b* is formed on a portion where the first finger line 42*a* is to be formed. When the second layer 420*b* is formed, the first finger line 42*a* can be formed to be extended in the first direction. Accordingly, the first finger line 42*a* can be formed as a contact portion which is in direct contact with the first conductive region 20 in a portion where the first pad portion 422 or the first layer 420*a* is not formed, and a non-contact portion which is spaced apart from the first conductive type region 20 with the first pad portion 422 or the first layer 420*a* therebetween in a portion formed on the first pad portion 422 or the first layer 420*a*.

According to this embodiment, since the wiring member 142 being extended in the second direction is positioned across the plurality of first finger lines 42*a* and the plurality of first pad portions 422, the plurality of first finger lines 42*a* and the plurality of first pad portions 422 can be connected in the second direction through the wiring member 142 without the first line portion 421. Thus, the first line portion can be omitted, thereby reducing the material cost of the first electrode 42 and simplifying the process.

For example, in the present embodiment, it is illustrated that the first line portion 421 is not provided but the connection portion 424*b* connecting the plurality of dividing portions 424*a* in the second direction is further included. However, the embodiments of the present invention are not limited thereto and need not include both the first line portion 421 and the connection portion 424*b*.

In the above-described embodiments, the first layer 420*a* constituting a non-contact portion or a non-contact electrode is first formed on the first conductive type region 20, and the second layer 420*b* for forming a contact portion or a contact electrode is formed thereon. However, the embodiments of the present invention are not limited thereto. The modification will be described in detail with reference to FIGS. 18 and 19.

Figure 18:
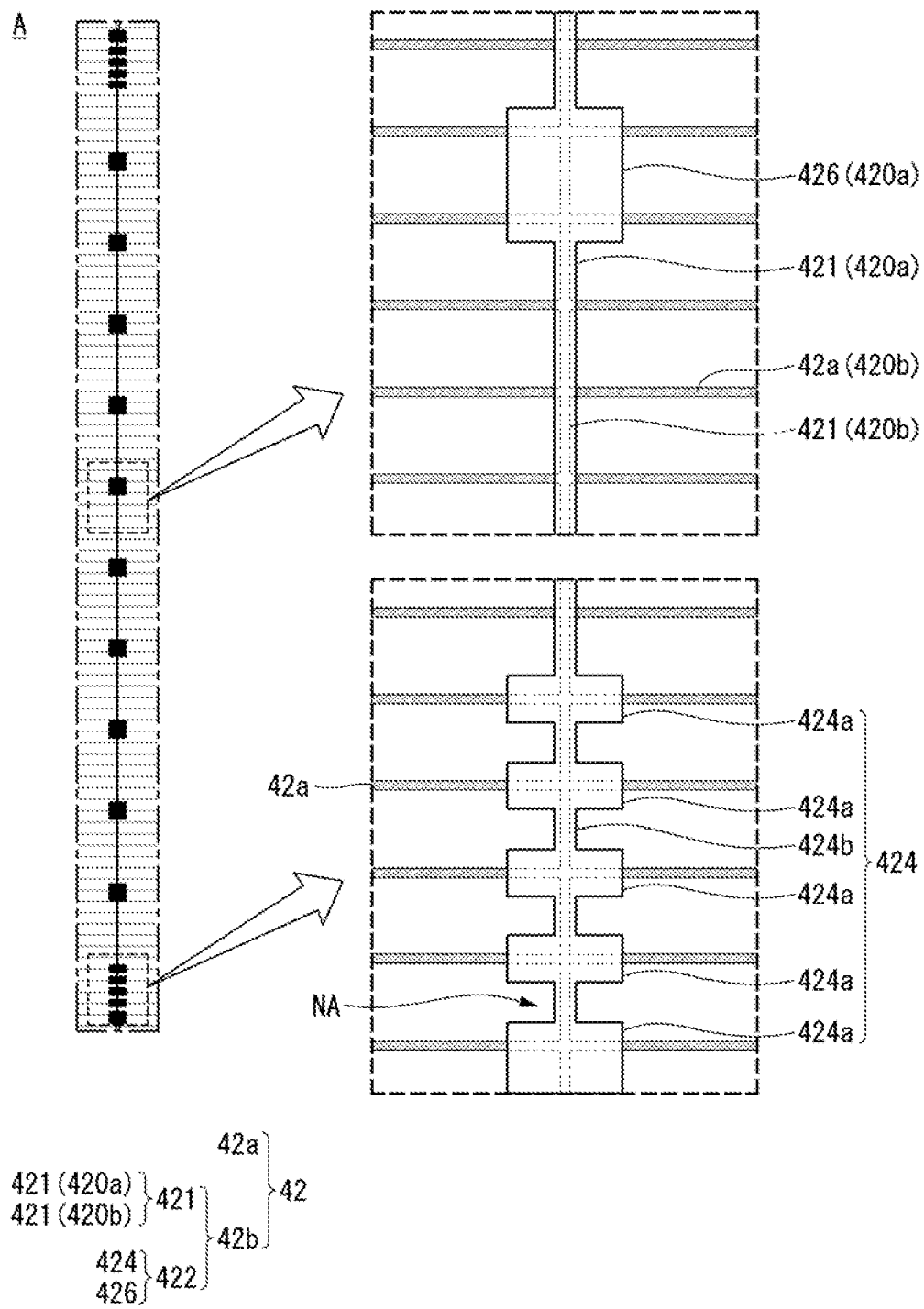
FIG. 18 is a partial front plan view showing a solar cell according to another embodiment of the present invention.
Figure 19:
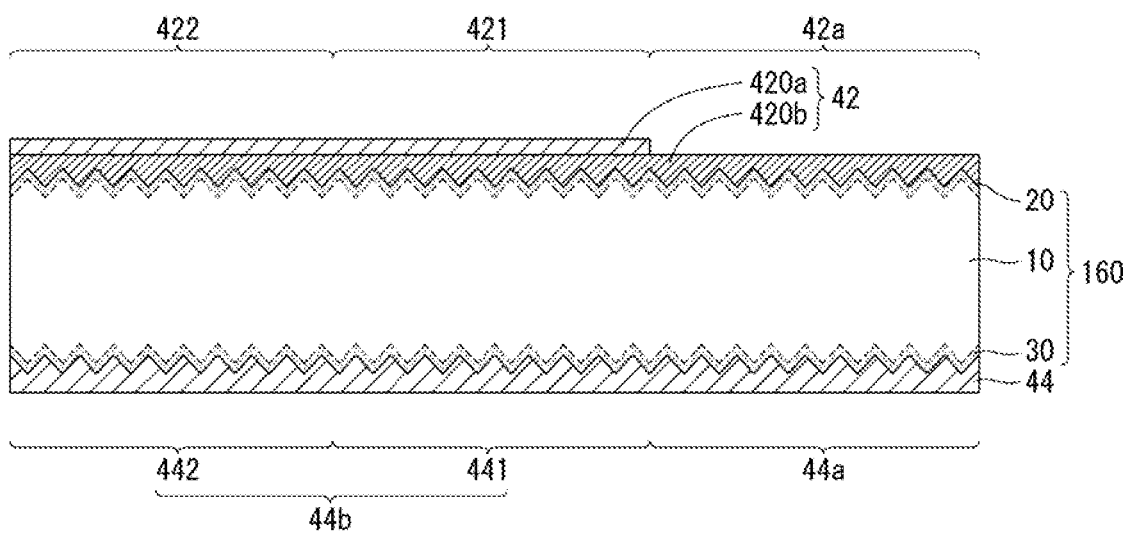
FIG. 19 is a schematic cross-sectional view of a solar cell shown in FIG. 18.

FIG. 18 is a partial front plan view showing a solar cell according to another embodiment of the present invention, and FIG. 19 is a schematic cross-sectional view of the solar cell shown in FIG. 18. FIG. 18 shows a portion corresponding to FIG. 6 for the sake of simplicity and clear illustration, and FIG. 19 shows a portion corresponding to FIG. 12.

Referring to FIGS. 18 and 19, in this embodiment, the second layer 420*b* for forming a contact portion or a contact electrode is first formed on the first conductive type region 20, and the first layer 420*a* constituting a non-contact portion or a non-contact electrode is formed thereon. Then, an entire portion of the first finger line 42*a* can constitute a contact electrode contacting the first conductive region 20 to effectively collect the carriers. The first pad portion 422 or the first layer 420*a* is positioned apart from the first conductive type region 20 on the first insulating layer in a portion where the first finger line 42*a* is not formed, and is not electrically connected to the first conductive type region 20 at the corresponding portion, and is connected to the first conductive type region 20 by the first finger line 42*a* electrically connected to the first pad portion 422 and positioned at another position in a plan view. If there is a portion formed in the first pad portion 422 overlapping the portion where the first finger line 42*a* is formed, since the first pad portion 422 or the first layer 420*a* is positioned on the first finger line 42*a* in the corresponding portion, the first pad portion 422 or the first layer 420*a* is positioned apart from the first conductive type region 20 but electrically connected to the first conductive type region 20 through the first finger line 42*a* in the corresponding portion.

In FIGS. 13 to 19, the inner pad 426 and the outer pad 424 are the same as the inner pad 426 and the outer pad 424 shown in FIG. 6, respectively. However, the embodiments of the present invention are not limited thereto. Thus, the outer pad 424 can have one of the shapes or arrangements shown in FIGS. 7 through 10, or any other shapes or arrangements, and the inner pad 426 can have one of the shapes or arrangements shown in FIG. 11, or any other shapes or arrangements.

Figure 20:
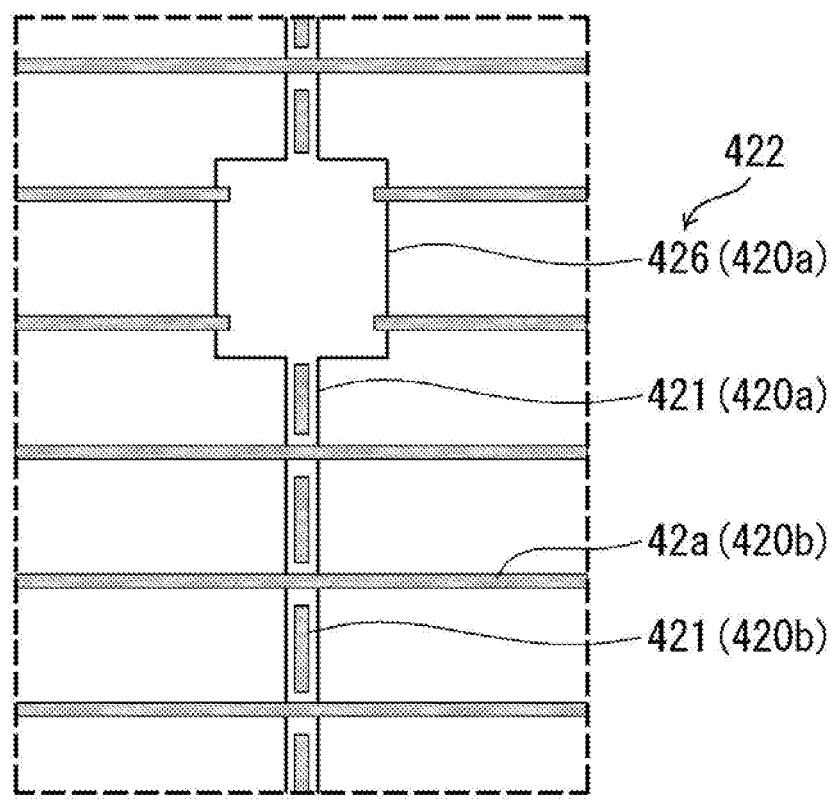
FIG. 20 is a partial front plan view showing a solar cell according to another embodiment of the present invention.

In addition, in the above-described embodiments, it is illustrated that the second layer 420*b* or the first finger line 42*a* is formed to be elongated in the first direction in a portion overlapping the portion where the first layer 420*a* or the first pad portion 422 is formed. However, the embodiments of the present invention are not limited thereto. Therefore, as shown in FIG. 20, an unformed portion in which the second layer 420*b* or the first finger line 42*a* is not formed is formed at a portion overlapping the portion where the first layer 420*a* or the first pad portion 422 is formed, and the second layer 420*b* or the first finger line 42*a* can include a plurality of portions spaced apart from each other at the portion where the first layer 420*a* or the pad portions 422 and 442 is formed. Thus, the amount of the material forming the second layer 420*b* or the first finger line 42*a* can be reduced. Here, one second layer 420*b* or the first finger line 42*a* can be partially overlapped with one side of the first pad portion 422, and the second layer 420*b* or the first finger line 42*a* can be partially overlapped with the other side of the first pad portion 422. Thus, the first finger line 42*a* and the first pad portion 422 can be stably connected.

Figure 21:
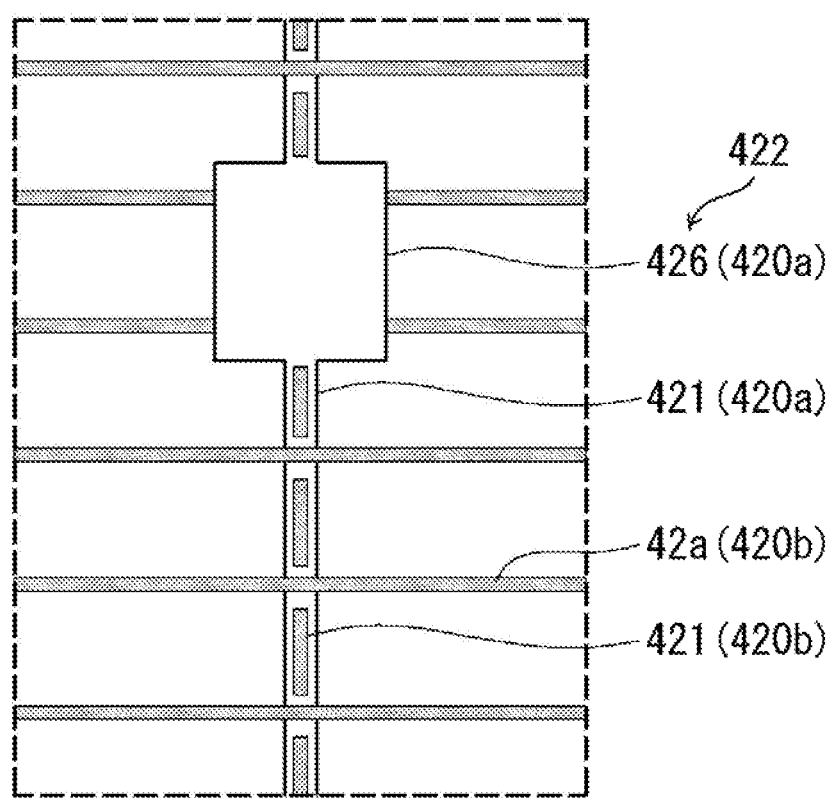
FIG. 21 is a partial front plan view showing a solar cell according to another embodiment of the present invention.

In the above-described embodiments, a part of at least one of the first finger line 42*a*, the first line portion 421 and the connection portion 424*b* is positioned to be overlapped on the first pad portion 422, and the first layer 420*a* and the second layer 420*b* different from each other are provided on at least a part of the first pad portion 422. However, the embodiments of the present invention are not limited thereto. Therefore, as shown in FIG. 21, the first pad portion 422 and the second layer 420*b* or the first finger line 42*a* need not overlap each other, and the first pad portion 422 and side surfaces of the second layer 420*b* or the first finger line 42*a* can be in contact with and electrically connected to each other. In this structure, the first pad portion 422 can be a single layer composed of the first layer 420*a*. In FIGS. 20 and 21, although the inner pad 426 is shown as an example of the first pad portion 422, the second layer 420*b* or the first finger line 42*a* positioned on the outer pad 424 can have at least one of the structures described above. The structures of the inner pad 426 and the first finger line 42*a* and the structures of the outer pad 424 and the first finger line 42*a* can be the same or different from each other.

Figure 22:
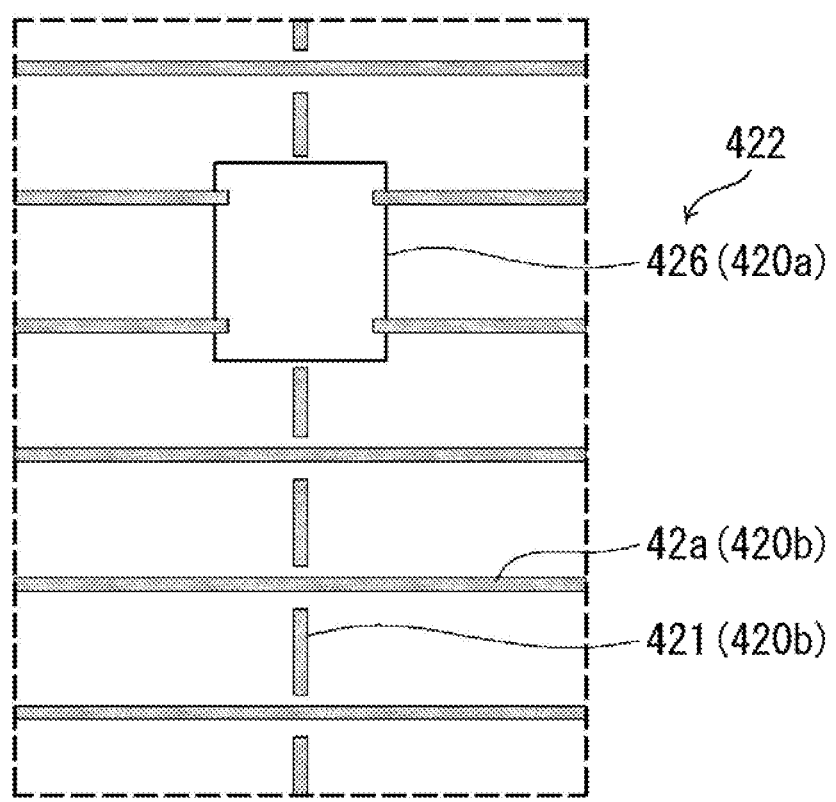
FIG. 22 is a partial front plan view showing a solar cell according to another embodiment of the present invention.

In the above-described embodiments, the first layer 420*a* and the second layer 420*b* constituting the first line portion 421 are elongated in the second direction so as to connect the plurality of first finger lines 42*a*. However, the embodiments of the present invention are not limited thereto. Therefore, as shown in FIG. 20, the second layer 420*b* constituting the first line portion 421 can be spaced apart from the first finger line 42*a* between the first finger lines 42*a* spaced apart from each other. That is, the second layer 420*b* constituting the first line portion 421 can have an unformed portion at an intersection with the first finger line 42*a*. Thus, the amount of the material forming the second layer 420*b* or the first line portion 421 can be reduced. At this time, the first layer 420*a* constituting the first line portion 421 has a shape elongated in the second direction while having an intersection intersecting the plurality of first finger lines 42*a*. However, the embodiments of the present invention are not limited thereto. Accordingly, the first layer 420*a* constituting the first line portion 421 can also be spaced apart from the first finger line 42*a* between the first finger lines 42*a* spaced from each other. As another example, the second layer 420*b* constituting the first line portion 421 can have a shape elongated in the second direction while having an intersection at which the plurality of first finger lines 42*a* intersect with each other, and the first layer 420*a* constituting the first line portion 421 can be spaced apart from the first finger line 42*a* between the first finger lines 42*a* spaced from each other. As another example, as shown in FIG. 22, at least one of the first layer 420*a* and the second layer 420*b* constituting the first line portion 421 can be positioned apart from the first finger line 42*a* between the first finger lines 42*a*, and the other need not be provided. In this instance, the plurality of first finger lines 42*a* can be electrically connected by the wiring member 142 as in the embodiment shown in FIG. 17. Various other modifications or variations are possible. In FIGS. 20 and 22, although the inner pad 426 is shown as an example of the first pad portion 422, any one of the structures of the first line portion 421 described above can be applied to the connection portion 424*b* when the outer pad 424 has the connection portion 424*b*. The structure of the first line portion 421 and the structure of the connection portion 424*b* can be the same or different from each other.

In FIGS. 20 to 22, although the structures of the first finger line 42*a* and the first line portion 421 described above are shown to be provided, at least one of the structure of the first finger line 42*a* and the structure of the first line portion 421 can be applied and the other need not be applied. In FIGS. 20 to 22, although the structure shown in FIG. 6 is shown as a basic structure, the positional relationship between the first layer 420*a* and the second layer 420*b*, the shape of the first pad portion 422, and the like can be applied to various embodiments and modifications as referring to FIGS. 7 to 19, and the like.

The features, structures, effects and the like according to the above-described embodiments are included in at least one embodiment of the present invention, and are not necessarily limited to only one embodiment. Furthermore, the features, structures, effects, and the like illustrated in the embodiments can be combined or modified in other embodiments by those skilled in the art to which the embodiments belong. Accordingly, contents related to these combinations and modifications should be construed as being included in the scope of the present invention.

What is claimed is:

1. A solar cell; comprising:
a semiconductor substrate;
a first conductive type region positioned at or on the semiconductor substrate;
a protective layer formed on the first conductive type region; and
a first electrode electrically connected to the first conductive type region,
wherein the first electrode includes a second layer penetrating the protective layer to form a contact electrode in the first conductivity type region, and a first layer formed on the second layer to form a non-contact electrode with the first conductivity type region,
wherein the first electrode further includes:
a plurality of first finger lines formed in a first direction and parallel to each other and formed by the second layer; and
a plurality of first bus bars including a plurality of first pad portions positioned in a second direction intersecting with the first direction, wherein the plurality of first pad portions are formed of the first layer on the protective layer to include a portion formed by overlapping a portion where the plurality of first finger lines are formed,
wherein the plurality of first pad portions have a different material or a different composition from the plurality of first finger lines, and are spaced apart from the first conductive type region,
wherein the plurality of first pad portions include:
at least one outer pad positioned to be adjacent to an edge of the semiconductor substrate in the second direction;
and a plurality of inner pads positioned inside from the at least one outer pad,
wherein the at least one outer pad includes a plurality of dividing portions having a non-forming portion having an interval or a length smaller than an average interval of the plurality of inner pads,
wherein a total length of the at least one outer pad is greater than a length of one of the plurality of inner pads,
wherein the plurality of first bus bars include a first line portion of the first layer connecting the plurality of first pad portions,
wherein the plurality of first finger lines include another first line portion of the second layer connecting the plurality of first finger lines,
wherein the first line portion of the first layer is disposed to overlap with the another first line portion of the second layer,
wherein each of the plurality of dividing portions is respectively disposed at each of a plurality of crossings of the plurality of first finger lines and the another first line portion,
and wherein among the at least one outer pad and the plurality of inner pads, only the at least one outer pad includes the plurality of dividing portions having the non-forming portion.

2. The solar cell of claim 1, wherein a distance between the plurality of dividing portions or a length of the non-forming portion is less than or equal to three times a pitch of the first finger line.

3. The solar cell of claim 2, wherein the distance between the dividing portions or the length of the non-forming portion is equal to or smaller than the pitch of the first finger line.

4. The solar cell of claim 1,
wherein an edge of the at least one outer pad adjacent to the edge of the semiconductor substrate is spaced a first distance from an outermost first finger line of the plurality of first finger lines,
and wherein the total length of the at least one outer pad is equal to or less than the first distance in the second direction.

5. The solar cell of claim 1, wherein the dividing portion overlaps the first finger lines or is positioned between the first finger lines.

6. The solar cell of claim 1, further comprising:
a connecting portion connecting the plurality of dividing portions in the second direction.

7. The solar cell of claim 1, wherein a length of the dividing portion is equal to, less than, or greater than the length of the inner pad.

8. The solar cell of claim 1, wherein the plurality of first finger lines include a glass frit passing through the protective layer by heat treatment, and
wherein the plurality of first pad portions do not include the glass frit passing through the protective layer by heat treatment or include the glass frit less than the plurality of first finger lines.

9. The solar cell of claim 1, wherein the solar cell further includes a second conductive type region, and a second electrode electrically connected to the second conductive type region, and
wherein the second electrode includes:
a plurality of second finger lines formed in a first direction and parallel to each other; and
a plurality of second bus bars including a plurality of second pad portions positioned in the second direction.

10. The solar cell of claim 9, wherein each of the plurality of second finger lines and the plurality of second bus bars includes a contact portion which is in direct contact with the second conductive type region.

11. The solar cell of claim 9, wherein the plurality of second finger lines and the plurality of second pad portions have the same material, the same composition, or the same multi-layered structure, or the plurality of second finger lines and the plurality of second pad portions have a different material, a different composition, or a different multi-layered structure.

12. The solar cell of claim 1, wherein a thickness of the first layer is less than a thickness of the second layer.

13. A solar cell panel, comprising:
a plurality of solar cells including first and second solar cells; and
a plurality of wiring members electrically connecting the first and second solar cells,
wherein each of the first and second solar cells includes:
a semiconductor substrate;
a first conductive type region positioned at or on the semiconductor substrate;

a protective layer formed on the first conductive type region; and a first electrode electrically connected to the first conductive type region, wherein the first electrode includes a second layer penetrating the protective layer to form a contact electrode in the first conductivity type region, and a first layer formed on the second layer to form a non-contact electrode with the first conductivity type region, wherein the first electrode further includes:

a plurality of first finger lines formed in a first direction and parallel to each other and formed by the second layer; and a plurality of first bus bars including a plurality of first pad portions positioned in a second direction intersecting with the first direction, wherein the plurality of first pad portions are formed of the first layer on the protective layer to include a portion formed by overlapping a portion where the plurality of first finger lines are formed, wherein the plurality of first pad portions have a different material or a different composition from the plurality of first finger lines, and are spaced apart from the first conductive type region, wherein the plurality of first pad portions include:

at least one outer pad positioned to be adjacent to an edge of the semiconductor substrate in the second direction; and a plurality of inner pads positioned inside from the at least one outer pad, wherein the at least one outer pad includes a plurality of dividing portions having a non-forming portion having an interval or a length smaller than an average interval of the plurality of inner pads, wherein the plurality of first bus bars include a first line portion of the first layer connecting the plurality of first pad portions, wherein the plurality of first finger lines include another first line portion of the second layer connecting the plurality of first finger lines, wherein the first line portion of the first layer is disposed to overlap with the another first line portion of the second layer, wherein each of the plurality of dividing portions is respectively disposed at each of a plurality of crossings of the plurality of first finger lines and the another first line portion, and wherein among the at least one outer pad and the plurality of inner pads, only the at least one outer pad includes the plurality of dividing portions having the non-forming portion.

14. The solar cell panel of claim 13, wherein each of the plurality of wiring members includes a core layer, and a solder layer formed on a surface of the core layer and soldered to the first pad portion.

15. The solar cell panel of claim 13, wherein a number of the plurality of wiring members is 5 to 33 in the first direction based on one surface of the solar cell, or wherein a width of each of the plurality of wiring members is 250 to 500 um, or wherein the plurality of wiring members have a cross-sectional shape including circular or rounded portions.

16. The solar cell panel of claim 13, wherein a total length of the at least one outer pad is not more than 20 times a width of the plurality of wiring members in the second direction.

* * * * *